(12) United States Patent
Peterson et al.

(10) Patent No.: US 12,532,530 B2
(45) Date of Patent: Jan. 20, 2026

(54) DOPED ALUMINUM-ALLOYED GALLIUM OXIDE AND OHMIC CONTACTS

(71) Applicants: THE REGENTS OF THE UNIVERSITY OF MICHIGAN, Ann Arbor, MI (US); The Government of the United States of America, as represented by the Secretary of the Navy, Arlington, VA (US)

(72) Inventors: Rebecca L. Peterson, Ann Arbor, MI (US); Ming-Hsun Lee, Ann Arbor, MI (US); Alan G. Jacobs, Rockville, MD (US); Marko J. Tadjer, Vienna, VA (US)

(73) Assignees: The Regents of The University of Michigan, Ann Arbor, MI (US); The Government of the United States of America as Represented by the Secretary of the Navy, Arlington, VA (US)

( * ) Notice: Subject to any disclaimer, the term of this patent is extended or adjusted under 35 U.S.C. 154(b) by 408 days.

(21) Appl. No.: 17/940,231

(22) Filed: Sep. 8, 2022

(65) Prior Publication Data

US 2023/0074175 A1 Mar. 9, 2023

Related U.S. Application Data

(60) Provisional application No. 63/242,134, filed on Sep. 9, 2021.

(51) Int. Cl.
*H10D 62/80* (2025.01)
*H01L 21/425* (2006.01)
(Continued)

(52) U.S. Cl.
CPC .......... *H10D 64/62* (2025.01); *H01L 21/425* (2013.01); *H01L 21/443* (2013.01); *H01L 21/465* (2013.01); *H10D 62/80* (2025.01)

(58) Field of Classification Search
CPC ..... H01L 29/45; H01L 21/425; H01L 21/443; H01L 21/465; H01L 29/24; H01L 31/032;
(Continued)

(56) References Cited

U.S. PATENT DOCUMENTS 9,590,050 B2 3/2017 Hitora et al.
2002/0179910 A1* 12/2002 Slater, Jr. .............. H01L 21/046
257/E21.057
(Continued)

FOREIGN PATENT DOCUMENTS

CN 109087850 A 12/2018
CN 111223782 B 10/2020
(Continued)

OTHER PUBLICATIONS

Hassa, A. et al. "Influence of Oxygen Pressure On Growth Of Si-Doped β-(Al$_x$Ga$_{1-x}$)$_2$O$_3$ Thin Films on c-Sapphire Substrates by Pulsed Laser Deposition", ECS Journal of Solid State Science and Technology, 8 (7) Q3217-Q3220 (2019).
(Continued)

*Primary Examiner* — Christine S. Kim
*Assistant Examiner* — Sesha Sairaman Srinivasan
(74) *Attorney, Agent, or Firm* — Harness, Dickey & Pierce, P.L.C.

(57) ABSTRACT

A method for controlling a concentration of donors in an Al-alloyed gallium oxide crystal structure includes implanting a Group IV element as a donor impurity into the crystal structure with an ion implantation process and annealing the implanted crystal structure to activate the Group IV element to form an electrically conductive region. The method may
(Continued)

further include depositing one or more electrically conductive materials on at least a portion of the implanted crystal structure to form an ohmic contact. Examples of semiconductor devices are also disclosed and include a layer of an Al-alloyed gallium oxide crystal structure, at least one region including the crystal structure implanted with a Group IV element as a donor impurity with an ion implantation process and annealed to activate the Group IV element, an ohmic contact including one or more electrically conductive materials deposited on the at least one region.

15 Claims, 21 Drawing Sheets

(51) Int. Cl.

| | | |
|---|---|---|
| *H01L 21/441* | (2006.01) | |
| *H01L 21/443* | (2006.01) | |
| *H01L 21/465* | (2006.01) | |
| *H10D 1/40* | (2025.01) | |
| *H10D 8/60* | (2025.01) | |
| *H10D 30/47* | (2025.01) | |
| *H10D 30/63* | (2025.01) | |
| *H10D 30/87* | (2025.01) | |
| *H10D 62/10* | (2025.01) | |
| *H10D 62/13* | (2025.01) | |
| *H10D 62/17* | (2025.01) | |
| *H10D 64/23* | (2025.01) | |
| *H10D 64/62* | (2025.01) | |
| *H10F 30/227* | (2025.01) | |
| *H10F 77/12* | (2025.01) | |

(58) Field of Classification Search
CPC . H01L 31/108; H01L 21/441; H01L 29/0646; H01L 29/7828; H01L 29/812; H01L 31/1085; H01L 29/0603; H01L 29/0619; H01L 29/417; H01L 29/7838; H01L 29/872; H01L 29/0847; H01L 29/1066; H01L 29/7785; H01L 29/0843; H01L 29/86; H01L 29/7783; H01L 29/7784
See application file for complete search history.

(56) References Cited

U.S. PATENT DOCUMENTS

| | | | |
|---|---|---|---|
| 2007/0166967 A1* | 7/2007 | Ichinose | H10H 20/822 |
| | | | 438/510 |
| 2011/0233689 A1 | 9/2011 | Hata et al. | |
| 2012/0045661 A1* | 2/2012 | Kumaran | C30B 23/02 |
| | | | 252/301.4 R |
| 2012/0297219 A1* | 11/2012 | Kato | H03K 19/0008 |
| | | | 713/320 |
| 2015/0115279 A1 | 4/2015 | Sasaki | |
| 2015/0325659 A1* | 11/2015 | Hitora | H01L 21/02433 |
| | | | 257/43 |
| 2016/0002823 A1 | 1/2016 | Sasaki et al. | |
| 2016/0042949 A1 | 2/2016 | Sasaki et al. | |
| 2020/0144377 A1 | 5/2020 | Higashiwaki et al. | |
| 2021/0005721 A1 | 1/2021 | Kub et al. | |
| 2021/0013314 A1 | 1/2021 | Hu et al. | |
| 2021/0217854 A1* | 7/2021 | Kanno | H10D 62/80 |

FOREIGN PATENT DOCUMENTS

| | | | |
|---|---|---|---|
| JP | 2014072533 A | * | 4/2014 |
| JP | 2018032699 A | * | 3/2018 |
| WO | WO-2020096838 A1 | | 5/2020 |

OTHER PUBLICATIONS

Kamimura, Takafumi et al., "Effect of (AlGa)$_2$O$_3$ back barrier on device characteristics of β-Ga$_2$O$_3$ metal-oxide-semiconductor field-effect transistors with Si-implanted channel", Japanese Journal of Applied Physics 60, 030906 (2021).

Jinno, Riena et al., "Thermal stability of a—(Al$_x$Ga$_{1-x}$)$_2$O$_3$ films grown on c-plane sapphire substrates with an Al composition up to 90%", Japanese Journal of Applied Physics 60, SBBD13 (2021).

Sasaki, K et al., " Si-Ion Implantation Doping in β-GA2O3 And Its Application To Fabrication Of Low-Resistance Ohmic Contacts", Applied Physics Express 6(8), (2013).

* cited by examiner

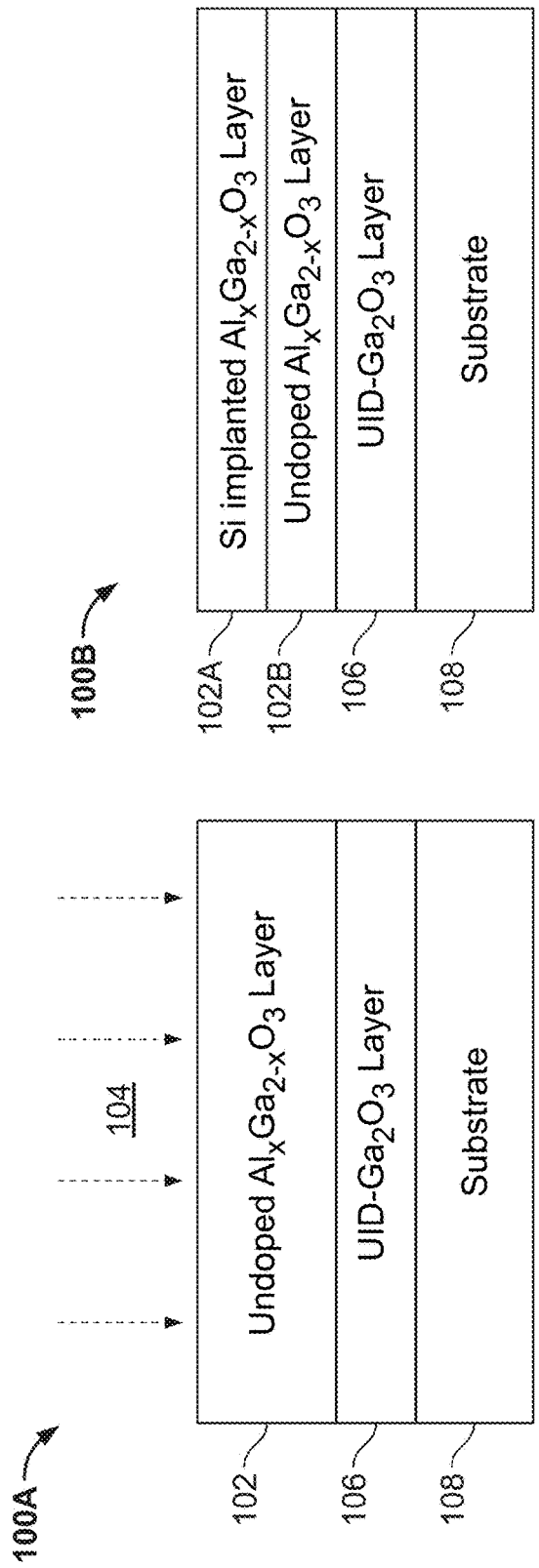
FIG. 1A  FIG. 1B  FIG. 2

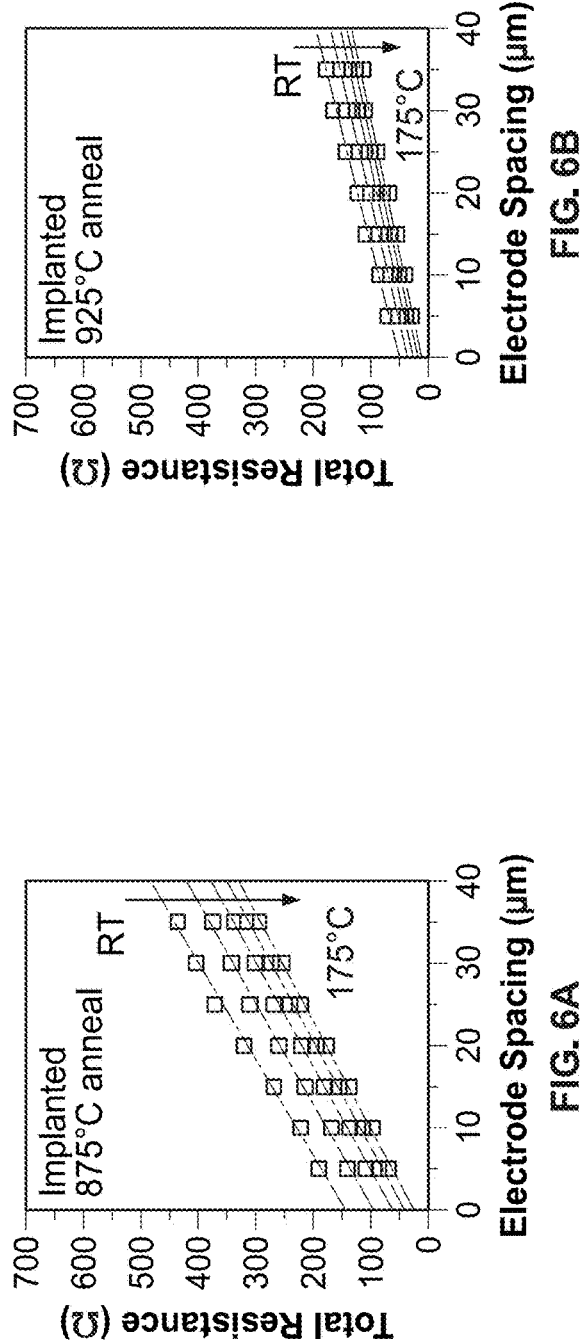
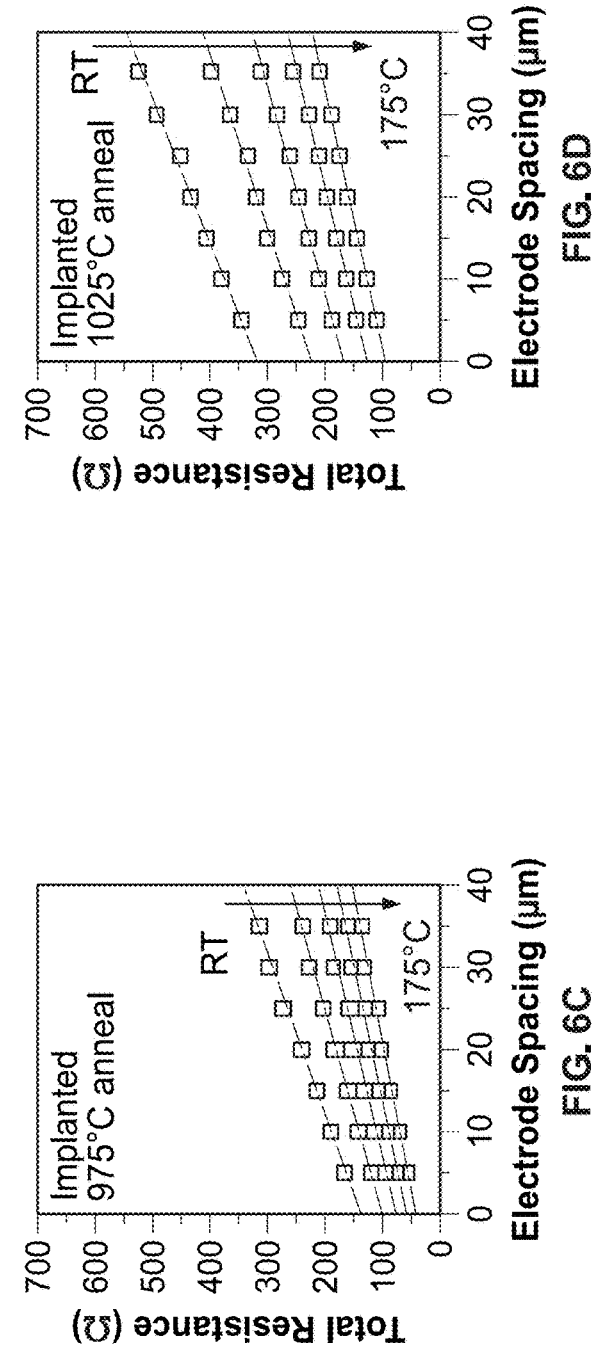
FIG. 6A  FIG. 6B  FIG. 6C  FIG. 6D

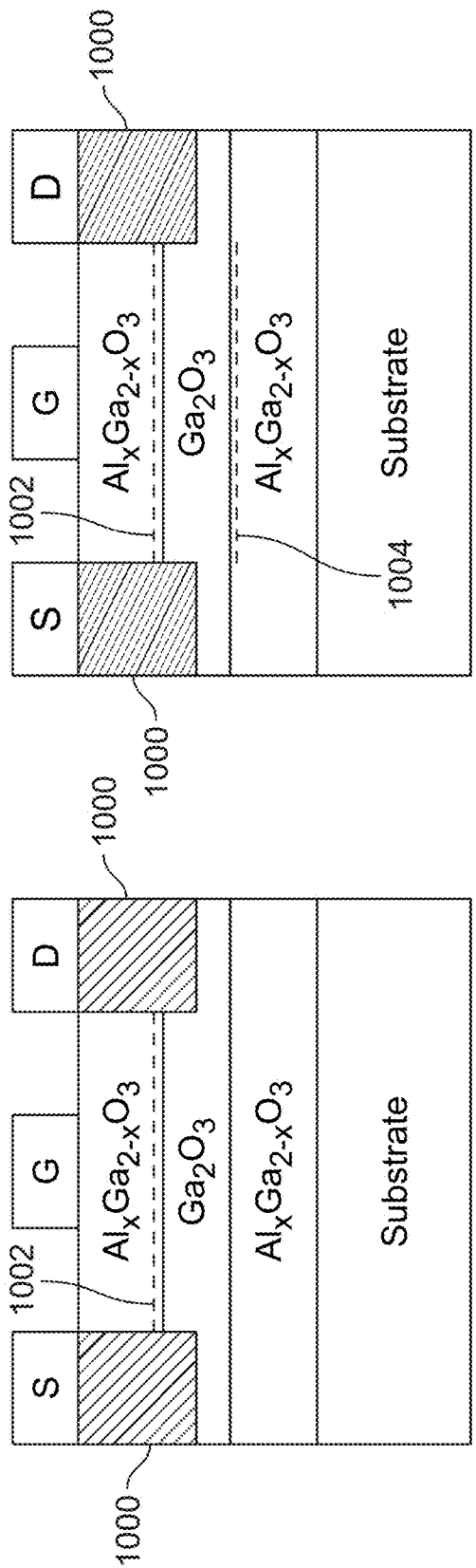
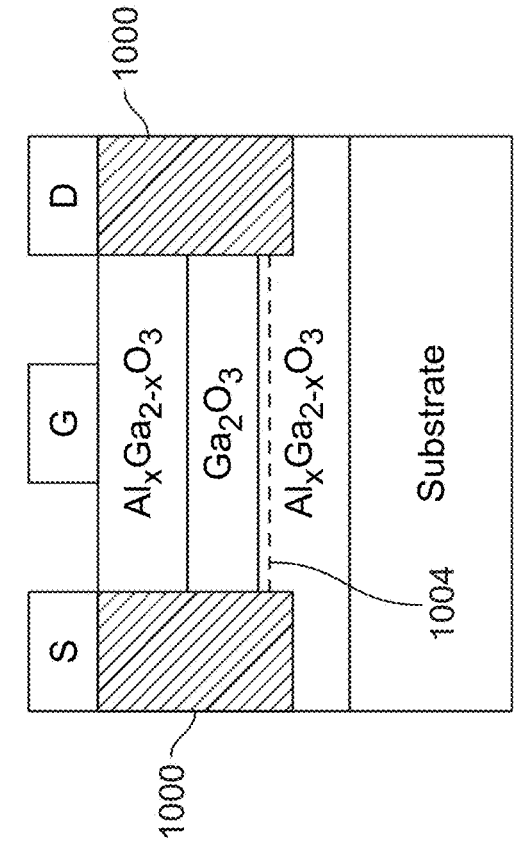
FIG. 14A
FIG. 14B
FIG. 14C

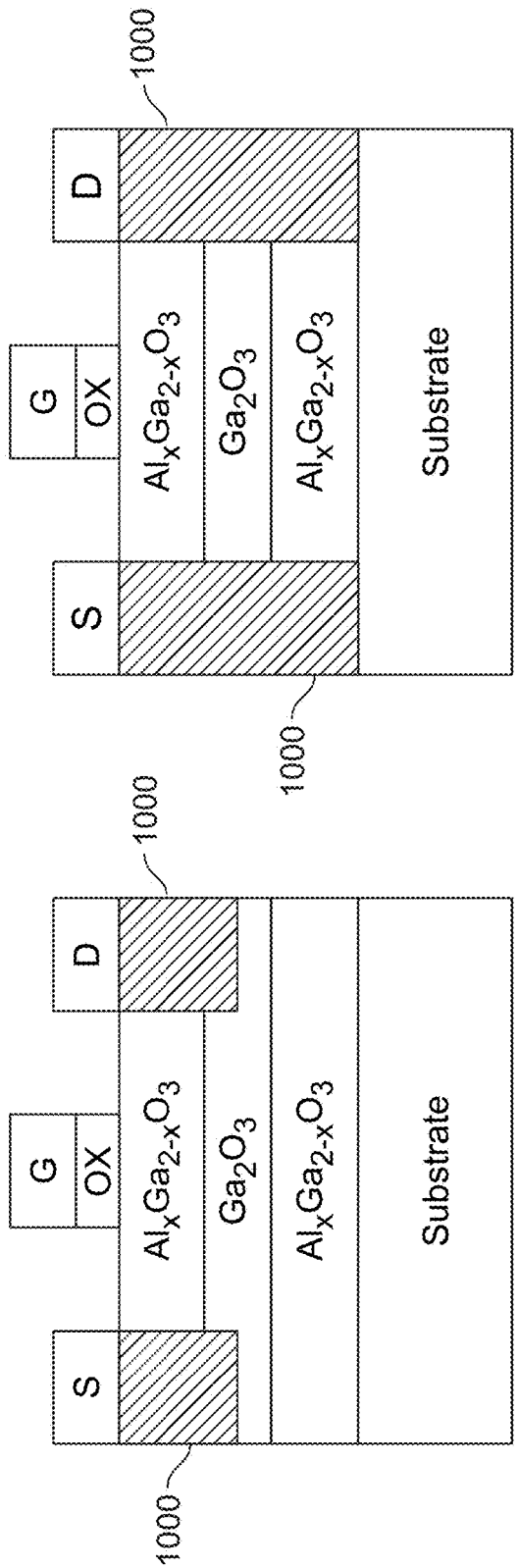
FIG. 15A
FIG. 15B
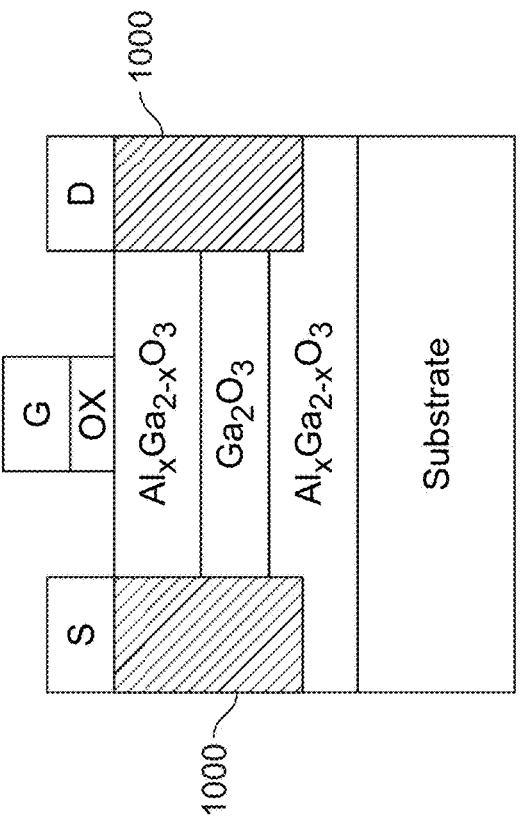
FIG. 15C

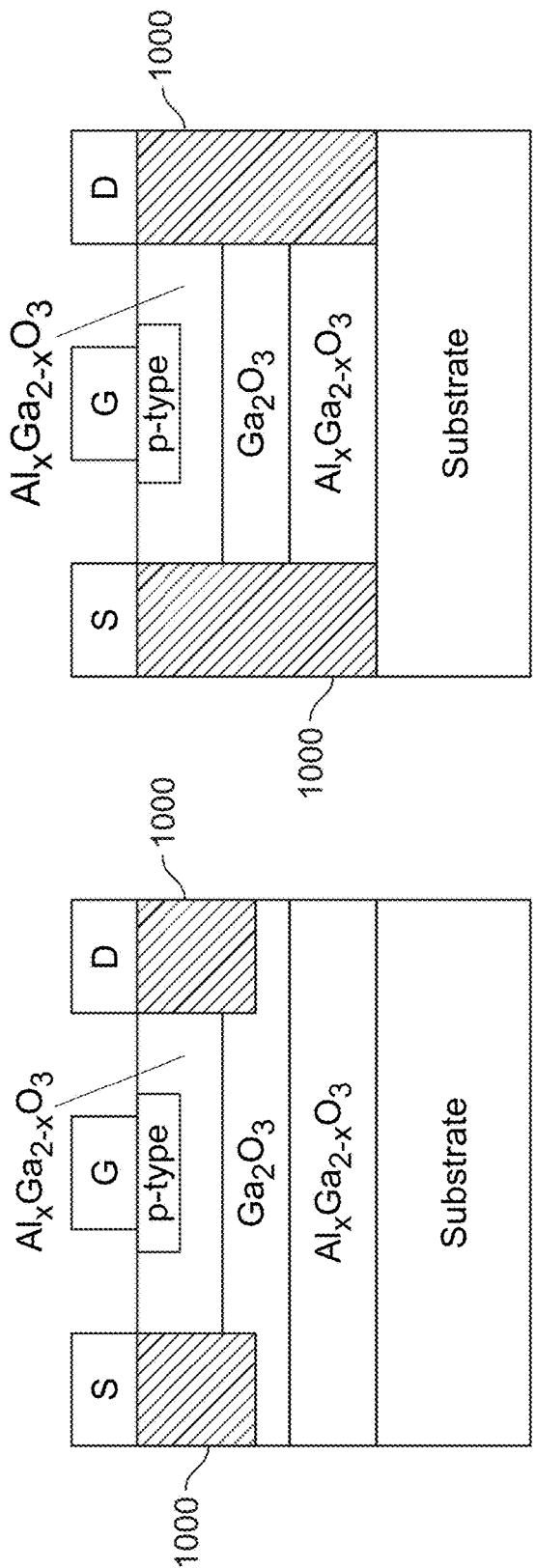
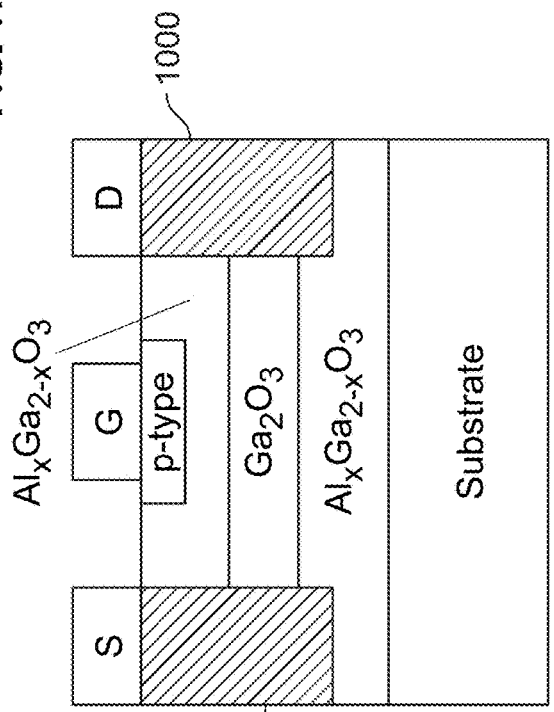
FIG. 17A
FIG. 17B
FIG. 17C

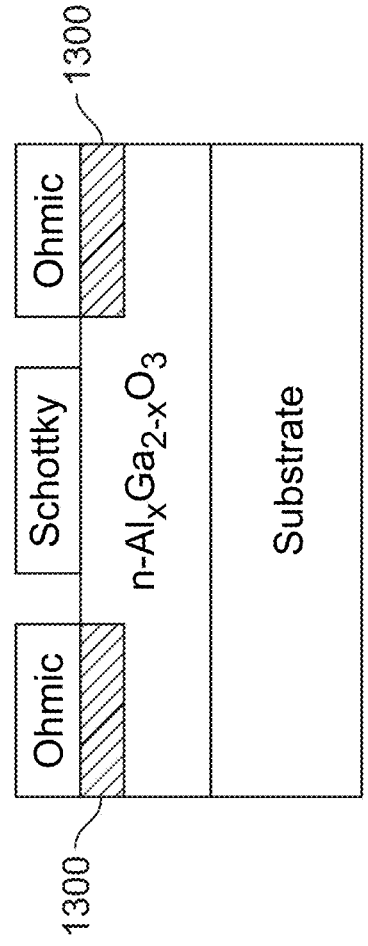
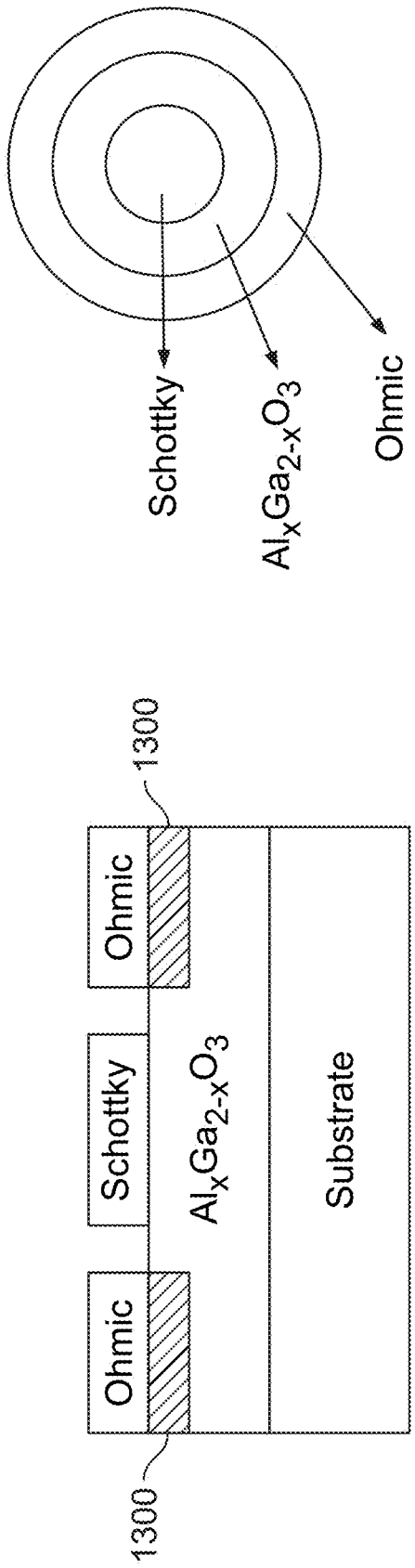
FIG. 20B
FIG. 20C
FIG. 20A

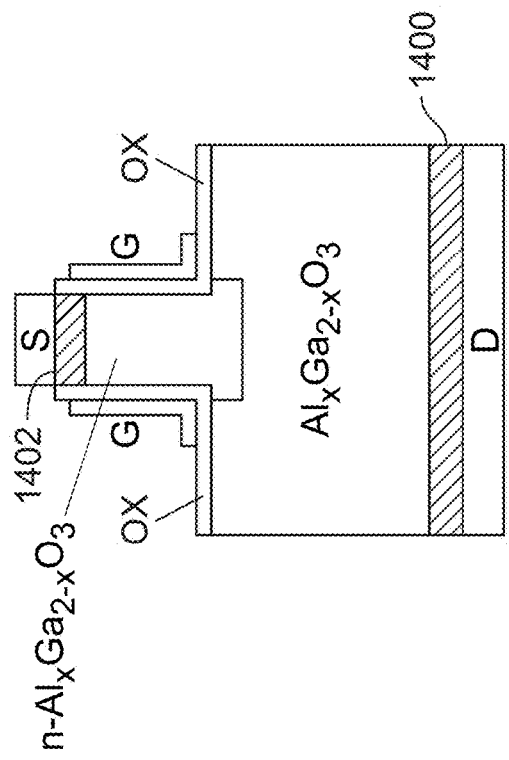
FIG. 22A
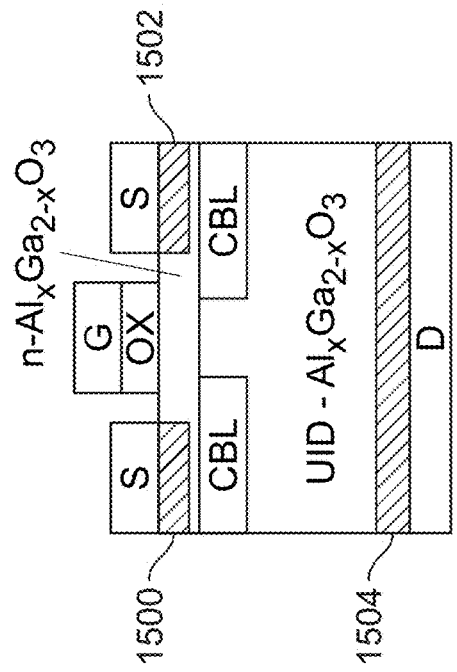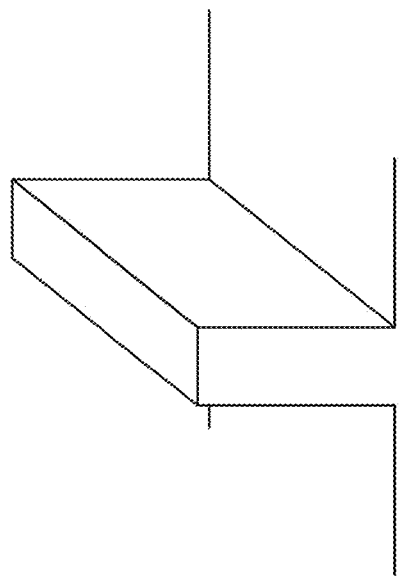
FIG. 22B
FIG. 23
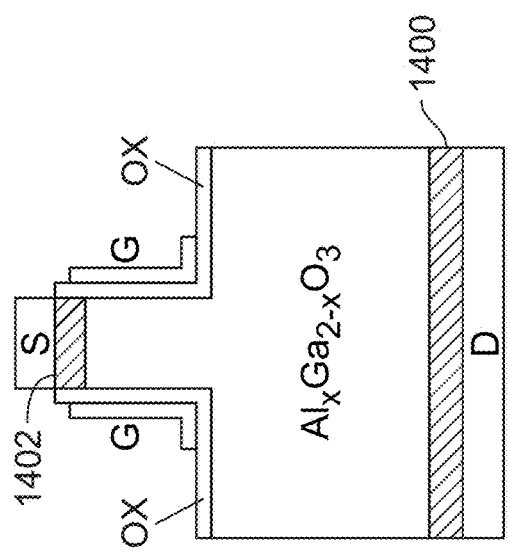
FIG. 22C

DOPED ALUMINUM-ALLOYED GALLIUM OXIDE AND OHMIC CONTACTS

CROSS-REFERENCE TO RELATED APPLICATIONS

This application claims the benefit and priority of U.S. Provisional Application No. 63/242,134 filed on Sep. 9, 2021. The entire disclosure of the above application is incorporated herein by reference.

GOVERNMENT CLAUSE

The invention was made with government support under N00014-17-1-2998 awarded by the Office of Naval Research. The government has certain rights in the invention.

FIELD

The present disclosure relates to doped aluminum-alloyed gallium oxide and ohmic contacts.

BACKGROUND

Doping is the process of implanting impurities such as a group III, IV, or V species into materials to alter their properties. The implanted materials may then be used to form contacts such as ohmic contacts. For example, a material such as gallium nitride (GaN) or gallium oxide ($Ga_2O_3$) may be implanted with silicon (Si) or another group IV element, and then a contact may be formed on the implanted material through conventional methods.

This section provides background information related to the present disclosure which is not necessarily prior art.

SUMMARY

This section provides a general summary of the disclosure, and is not a comprehensive disclosure of its full scope or all of its features.

According to one aspect of the present disclosure, a method for controlling a concentration of donors in an aluminum-alloyed gallium oxide ($Al_xGa_{2-x}O_3$) crystal structure is disclosed. The method includes implanting a Group IV element as a donor impurity into the $Al_xGa_{2-x}O_3$ crystal structure with an ion implantation process and annealing the implanted $Al_xGa_{2-x}O_3$ crystal structure to activate the Group IV element to form an electrically conductive region.

According to another aspect of the present disclosure, a method for forming an ohmic contact is disclosed. The method includes implanting a Group IV element as a donor impurity into an $Al_xGa_{2-x}O_3$ crystal structure with an ion implantation process, where $0<x<2$, annealing the implanted $Al_xGa_{2-x}O_3$ crystal structure to activate the Group IV element to form an electrically conductive region, and depositing one or more electrically conductive materials on at least a portion of the implanted $Al_xGa_{2-x}O_3$ crystal structure to form the ohmic contact.

According to another aspect of the present disclosure, a semiconductor device includes a layer of an $Al_xGa_{2-x}O_3$ crystal structure, where $0<x<2$, at least one region including the $Al_xGa_{2-x}O_3$ crystal structure implanted with a Group IV element as a donor impurity with an ion implantation process and annealed to activate the Group IV element, and an ohmic contact including one or more electrically conductive materials deposited on the at least one region.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1A is a block diagram showing an aluminum-alloyed gallium oxide material, according to one example embodiment of the present disclosure.

FIG. 1B is a block diagram showing the aluminum-alloyed gallium oxide material of FIG. 1A implanted with silicon ions, according to another example embodiment.

FIG. 2 is a block diagram showing ohmic contacts formed on the implanted, aluminum-alloyed gallium oxide material of FIG. 1B, according to another example embodiment.

FIGS. 3A-E, 4-5, 6A-D, 7-10, 11A-D, and 12A-B are graphs showing various characteristics of an exemplary semiconductor device having ohmic contacts formed on implanted, aluminum-alloyed gallium oxide material, according to other example embodiments.

Figure 12B:
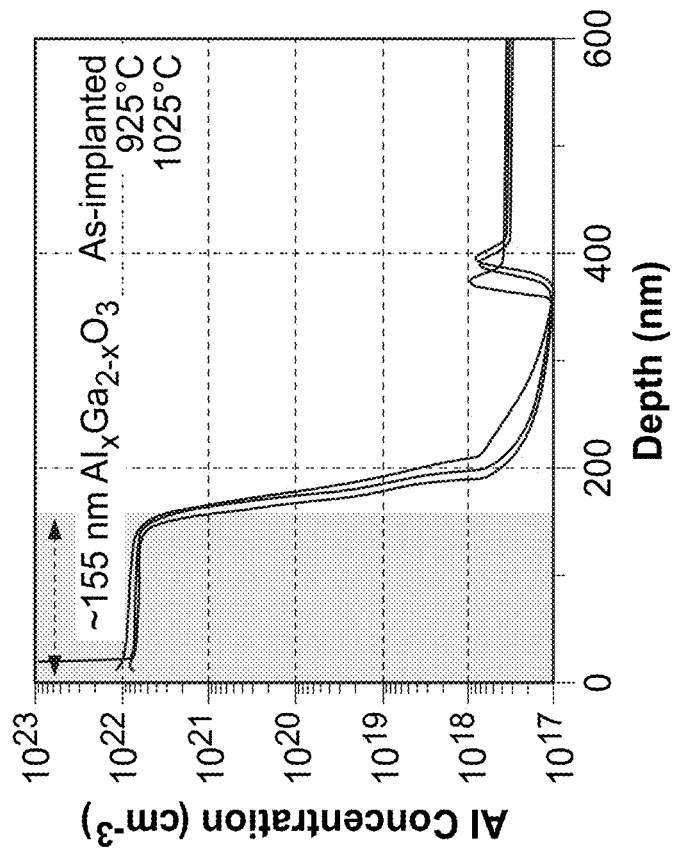
Figure 12A:
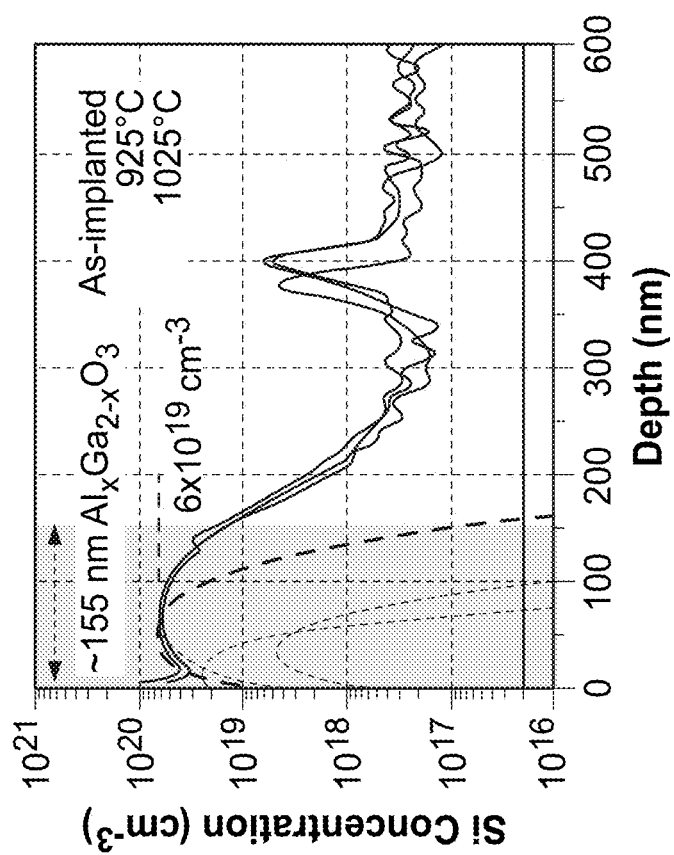
Figure 12D:
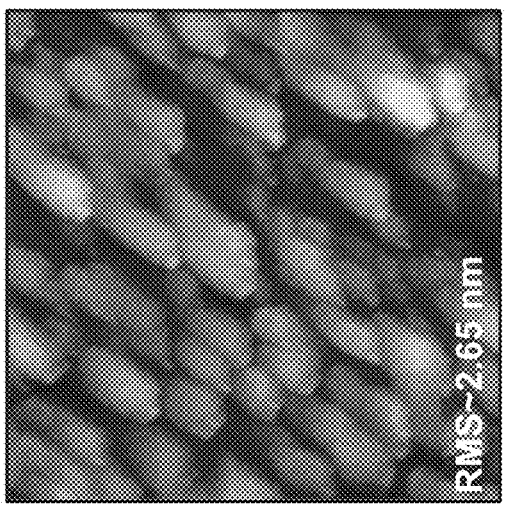
Figure 12E:
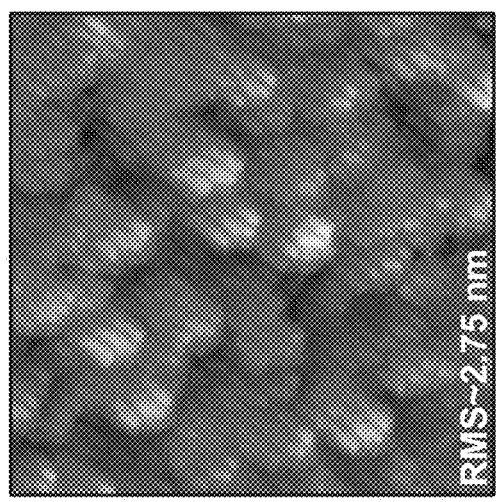
Figure 12C:
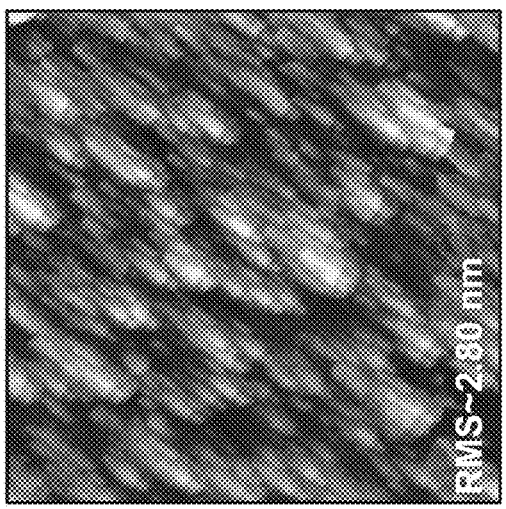
Figure 13A:
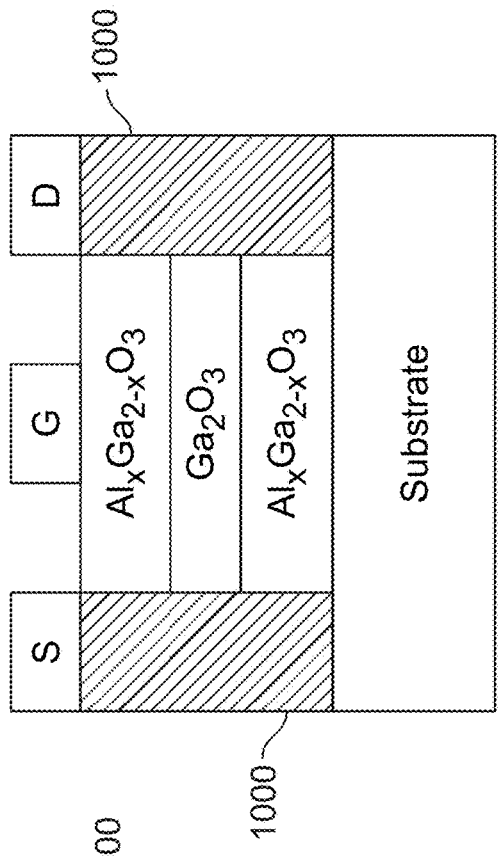
Figure 13B:
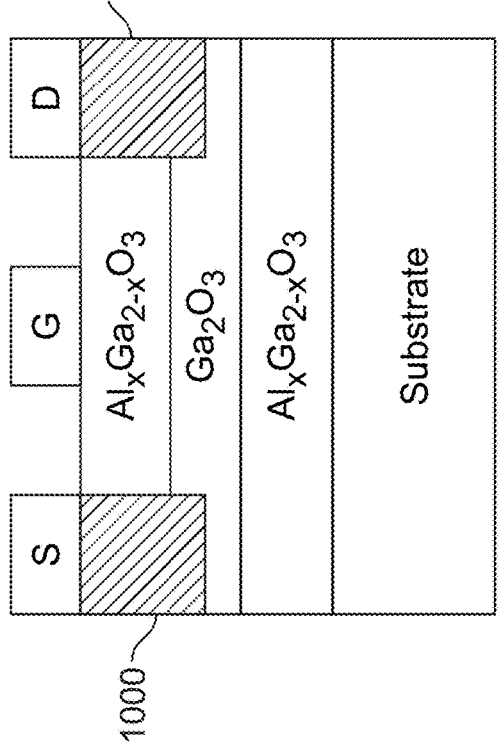
Figure 13C:
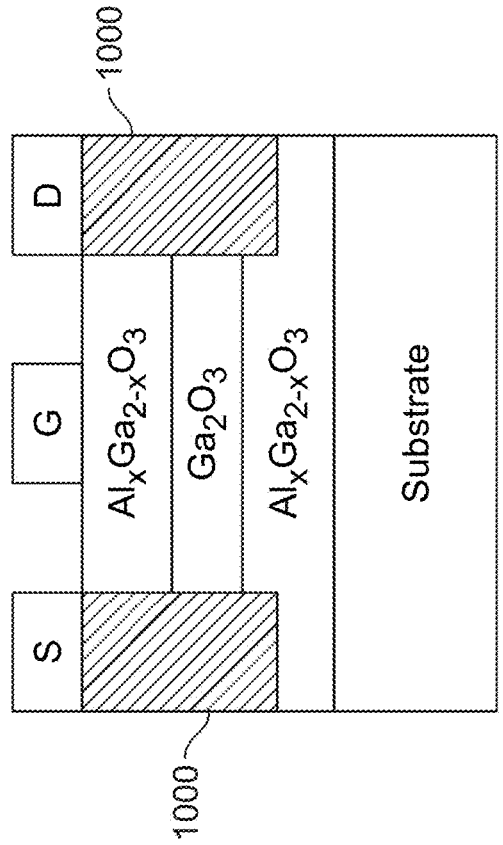

FIGS. 12C-E are atomic force microscopy images showing an un-implanted aluminum-alloyed gallium oxide material, an implanted aluminum-alloyed gallium oxide material, and an implanted aluminum-alloyed gallium oxide material annealed at 925° C., respectively, according to other example embodiments.

FIGS. 13A-C, 14A-C, 15A-C, 16A-C, 17A-C, 18A-C, 19A-C, 20A-C, 21A-B, 22A-C, 23, 24A-B, 25A-B, and 26 are block diagrams of exemplary semiconductor devices including implanted, aluminum-alloyed gallium oxide material and contacts formed on the implanted material, according to other example embodiments.

Corresponding reference numerals indicate corresponding parts and/or features throughout the several views of the drawings.

DETAILED DESCRIPTION

Example embodiments will now be described more fully with reference to the accompanying drawings.

Many power electronic devices require materials that can withstand high electric fields. This may be achieved using wide bandgap materials such as gallium nitride (GaN) and gallium oxide ($Ga_2O_3$). It is also desirable to achieve quality ohmic contacts with these wide bandgap materials exemplified by low contact resistance or specific contact resistivity. Aluminum-alloyed gallium oxide ($Al_xGa_{2-x}O_3$) is an attractive alternative to these materials because it has a wider bandgap than gallium nitride and gallium oxide, and hence, a higher breakdown field. As such, aluminum-alloyed gallium oxide is expected to be able to withstand higher electric fields as compared to other materials such as gallium nitride and gallium oxide. While it is known to form ohmic contacts by doping gallium oxide with Si-ion implantation, post-implant activation annealing, reactive ion etching, and metal electrode deposition, similar approaches of ion-implantation doping and ohmic contact formation for aluminum-alloyed gallium oxide have not yet been realized. Rather, doping of aluminum-alloyed gallium oxide has focused on delta doping, or growing a doped layer with metalorganic vapor-phase epitaxy (MOVPE), metalorganic chemical vapor deposition (MOCVD) or molecular beam epitaxy (MBE). However, these approaches require complex epitaxial processes, and the resulting dopant concentration may depend on parameters such as the aluminum alloy content (x). In addition, doping via epitaxy may increase the surface roughness and does not allow selective regions of the material to be doped which is very desirable for the fabrication of transistor devices. As such, the subject inventors developed solutions for selective doping an aluminum-alloyed gallium oxide (e.g., $\beta$-$Al_xGa_{2-x}O_3$) crystal structure n-type, controlling a concentration of donors in an aluminum-alloyed gallium oxide crystal structure, and forming an ohmic contact with a selectively doped, aluminum-alloyed gallium oxide region. Although $\beta$-$Al_xGa_{2-x}O_3$ is listed as an example crystal phase of aluminum-alloyed gallium oxide, it should be apparent to those skilled in art that other crystal phases of aluminum-alloyed gallium oxide (e.g., $\alpha$-$Al_xGa_{2-x}O_3$, $\gamma$-$Al_xGa_{2-x}O_3$, $\delta$-$Al_xGa_{2-x}O_3$, $\epsilon$-$Al_xGa_{2-x}O_3$, $\kappa$-$Al_xGa_{2-x}O_3$, etc.) could also be used.

For example, controlling a concentration of donors in an aluminum-alloyed gallium oxide ($Al_xGa_{2-x}O_3$) crystal structure may include implanting a Group IV element as a donor impurity into the aluminum-alloyed gallium oxide crystal structure with an ion implantation process, and annealing the implanted crystal structure to activate the Group IV element to form an electrically conductive region. In such examples, the aluminum-alloyed gallium oxide crystal structure is doped n-type (e.g., a controlled doping level) with a Group IV ion implant.

In such examples, "x" (e.g., the aluminum alloy content) in $Al_xGa_{2-x}O_3$ may be greater than zero and less than two (i.e., $0 < x < 2$). In some embodiments, "x" may be equal to 0.4.

In some examples, the ion implantation process includes accelerating ions of the Group IV element into the $Al_xGa_{2-x}O_3$ crystal structure. In such examples, the ion implantation may include a single implant step or multiple implant steps, and the Group IV element may be silicon (Si), tin (Sn), Germanium (Ge), etc.

Annealing of the implanted crystal structure may take place over a defined period of time in a suitable ambient environment. For example, the implanted crystal structure may be annealed over a defined period of time ranging from ten seconds to one hour. For instance, the implanted crystal structure may be annealed for ten seconds, one minute, ten minutes, twenty minutes, thirty minutes, forty minutes, fifty minutes, one hour, or any other suitable period of time between ten seconds and one hour. Additionally, the ambient environment may be any suitable oxygen-deficient environment including a single gas or multiple gases (e.g., a gas mixture). For example, the ambient environment may include a single gas such as nitrogen ($N_2$), argon (Ar), etc. In other examples, the ambient environment may include a gas mixture predominantly having, for example, nitrogen ($N_2$), argon (Ar), etc.

The concentration of donors may be controlled based on various parameters. For example, a wide range of donor concentrations may be achieved by varying Group IV implant dosages, implant energies, the number of implants, anneal temperatures, and atmospheres. For instance, the individual implant dosage may range between 2.15E13 ions/$cm^2$ and 4.05E14 ions/$cm^2$, an implant energy may range between 30 keV and 75 keV, the number of implants may range between 1 and 5, and an anneal temperature may range between 800° C. and 1100° C. The corresponding total implant dosage may range between 2.5E14 ions/$cm^2$ and 7.5E14 ions/$cm^2$. In such examples, the resulting concentrations of Group IV elements in the structure may range from 1E18 $cm^{-3}$ to 1.5E20 $cm^{-3}$. In other examples, individual implant dosage may range from a very low value such as in a 1E12 ions/$cm^2$ range or less to a very high value such as a 1E16 ions/$cm^2$ range or higher, depending on the desired doping level and doping profile versus depth. In another example, the implant energy or energies may range from 10 keV (e.g., for ultra-shallow implants) to 400 keV (e.g., for deep implants). Additionally, the number of implants may be significantly tailored depending on the profile desired.

As recognized by the inventors, a total implant concentration ranging from 2E19 $cm^{-3}$ to 9E19 $cm^{-3}$ and/or an anneal temperature ranging from 875° C. to 975° C. may provide for optimal results when using aluminum-alloyed gallium oxide. For example, with the total implant dosage of 5E14 ions/$cm^2$ resulting in a Group IV element concentration of 6E19 $cm^{-3}$, and/or the anneal temperature of about 925° C., high activation efficiency of the Group IV element and superb damage recovery of the crystalline structure may be achieved. Additionally, when a lower total implant dosage of 5E14 ions/$cm^2$ is used, residual defects from a high-dose implant are not exhibited. As a result, when using the optimal total implant dosage, Group IV element concentration, and anneal temperature, a desired ohmic contact may be created with the doped, aluminum-alloyed gallium oxide region where the contact has a low contact resistance and sheet resistance as further explained below.

As recognized by the inventors, the total optimal implant dosage and anneal temperature when using aluminum-alloyed gallium oxide were unexpected, particularly in view of an optimal total implant dosage and anneal temperature when using other gallium oxide compounds. For instance, when using another gallium oxide compound such as the gallium oxide compound disclosed in U.S. Pat. No. 9,611,567 to Sasaki et al., the optimal total implant dosage is 1E15 ions/$cm^2$, the concentration is 5E19 $cm^{-3}$, and the optimal anneal temperature is 1,000° C. As such, the optimal total implant dosage and anneal temperature when using aluminum-alloyed gallium oxide are substantially lower than the optimal total implant dosage and anneal temperature when using other gallium oxide compounds.

FIGS. 1A-B illustrate a sample 100A where silicon (Si) ions are being accelerated towards an aluminum-alloyed gallium oxide ($Al_xGa_{2-x}O_3$) crystal structure, and a sample 100B where silicon (Si) ions are implanted into the aluminum-alloyed gallium oxide ($Al_xGa_{2-x}O_3$) crystal structure. As shown in FIGS. 1A-B, the samples 100A, 100B each include a layer 106 having a gallium oxide ($Ga_2O_3$) material and a substrate 108. Additionally, the sample 100A of FIG. 1A includes a layer 102 having an undoped, aluminum-alloyed gallium oxide material, and the sample 100B of FIG. 1B includes a layer 102A having a Si implanted, aluminum-alloyed gallium oxide material and a layer 102B having an undoped, aluminum-alloyed gallium oxide material.

Although FIGS. 1A-B illustrate layers formed of specific materials, it should be apparent that other suitable variations may be employed. For example, the layer 106 is not required to be UID (unintentionally doped), the layer 102 is not required to be undoped, etc.

As shown, Si ions (represented by arrows 104 in FIG. 1A) are accelerated towards the aluminum-alloyed gallium oxide layer 102. Although the implant of the Si ions is shown as being perpendicular (normal) to the layer 102, it should be apparent that the Si ions may be implanted at any suitable angle relative to the sample 100A. For example, the implant of the Si ions may be conducted at an incident angle of seven degree off normal. In some examples, this may prevent a channeling effect. Alternatively, other angles (e.g., angles of more or less than seven degrees) may be desired to, for example, induce intentional channeling for deep junctions or doped layers and/or reduce straggle.

In the example of FIG. 1A, at least some of the Si ions become implanted into a portion of the layer 102, thereby creating the Si implanted, aluminum-alloyed gallium oxide layer 102A of FIG. 1B. After the Si ions are implanted, at least the layer 102A may be annealed (e.g., at a temperature ranging from 800° C. to 1100° C. for about thirty minutes) to activate the implanted Si ions to form an electrically conductive region, as explained above.

In some examples, the implantation of the Si ions may not reach the full depth of the layer 102. This region of the layer 102 is represented by the undoped, aluminum-alloyed gallium oxide layer 102B. For example, the layer 102 may have a thickness ranging from 10 nm to 300 nm. During implantation, the Si ions may reach a depth ranging from 10 nm to 300 nm. For example, if the layer 102 has a thickness of 100 nm and the Si ions reach a depth of 80 nm during implantation, the layer 102A may have a thickness of 80 nm, and the layer 102B may have a thickness of about 20 nm. In such examples, the total Si doping concentration may range from $1E18$ $cm^{-3}$ to $1.5E20$ $cm^{-3}$. In some examples, the total Si doping concentration may be about $6E19$ $cm^{-3}$.

In the example of FIGS. 1A-B, the layers 102, 102A, 102B, 106, 108 may include different characteristics. For example, the layer 106 of FIGS. 1A-B may be an unintentionally doped (UID), metal-organic chemical vapor phase deposition (MOCVD), epitaxy (epi) buffer layer. In some examples, the layer 106 may have a thickness of about 300 nm. Additionally, the substrate 108 may be, for example, iron (Fe) doped semi-insulating, gallium oxide ($Ga_2O_3$) substrate. Further, the layer 102 may be a MOCVD, epi-layer, and the layers 102A, B may be epi-layers.

Although the samples 100A, 100B of FIGS. 1A-B include a particular number of layers, it should be appreciated by one skilled in the art that the samples may include more or less layers. For example, the sample 100A may only include the aluminum-alloyed gallium oxide layer 102, and the sample 100B may only include the Si implanted, aluminum-alloyed gallium oxide layer 102A and the undoped, aluminum-alloyed gallium oxide layer 102B. In other examples, the samples may include more than three, four, five, etc. layers In some embodiments, ohmic contacts may be formed with the implanted aluminum-alloyed gallium oxide crystal structures described herein. For example, an ohmic contact may be formed by etching (e.g., reactive-ion etching, wet chemical etching, ion milling, etc.) at least a portion of the implanted aluminum-alloyed gallium oxide crystal structure to form an etched region, and depositing one or more electrically conductive materials on at least a portion of the etched region to form the ohmic contact. Etching before depositing the electrically conductive material(s) may ensure that the electrically conductive material is in contact with the heavily doped region. In other examples, an ohmic contact may be formed without etching as implant conditions can be made to produce high surface concentration without etching.

The electrically conductive material forms one or more contact electrodes. In such examples, the electrically conductive material may include any suitable electrically conductive metal material such as nickel, copper, titanium, silver, gold, etc., and/or alloys including one or more of nickel, copper, titanium, silver, gold, etc. In some embodiments, the electrically conductive material may include an alloy having titanium and gold. The electrically conductive material may include a single layer or multiple layers of suitable materials (e.g., a layer of titanium and a layer of gold, etc.).

In some examples, a post-metallization anneal may be completed when forming the ohmic contact. For example, the deposited electrically conductive material may be annealed at a temperature for a period of time. This may result more desirable ohmic contact properties. In some embodiments, the post-metallization anneal may be a rapid thermal anneal (RTA). For instance, the electrically conductive material may be annealed at a temperature ranging from 375° C. to 550° C. In other examples, the electrically conductive material may be annealed at a temperature ranging from 400° C. to 500° C. In some examples, the electrically conductive material may be annealed at a temperature of 470° C.

Additionally, the deposited electrically conductive material may be annealed for any suitable period of time. For example, the period of time may range from ten seconds to ten minutes. For instance, the deposited electrically conductive material may be annealed for ten seconds, one minute, five minutes, ten minutes, or any other suitable period of time between ten seconds and ten minutes.

Further, the deposited electrically conductive material may be annealed in any suitable ambient environment such as an oxygen-deficient environment. In some examples, the oxygen-deficient environment may include a single gas or multiple gases (e.g., a gas mixture). For example, the ambient environment may include a single gas such as nitrogen ($N_2$), argon (Ar), etc. In other examples, the ambient environment may include a gas mixture predominantly having, for example, nitrogen ($N_2$), argon (Ar), etc.

FIG. 2 illustrates a sample 200 created with an implanted aluminum-alloyed gallium oxide crystal structure, as described herein. Specifically, and as shown in FIG. 2, the sample 200 includes electrodes 210A, 210B, and the Si implanted, aluminum-alloyed gallium oxide layer 102A, the undoped, aluminum-alloyed gallium oxide layer 102B, the gallium oxide layer 106, and the substrate 108 of FIG. 1A.

In the example of FIG. 2, outer regions of the implanted, aluminum-alloyed gallium oxide layer 102A are etched (e.g., reactive-ion etched, etc.). In some examples, the layer 102A may be etched to a depth of about 45 nm. Then, an electrically conductive material such as a multi-layer stack containing titanium and gold is deposited on the etched regions. The electrically conductive material may then be annealed (as explained above) to form the electrodes 210A, 210B of the sample. In the example of FIG. 2, the electrodes 210A, 210B are ohmic contacts.

Figure 3A:
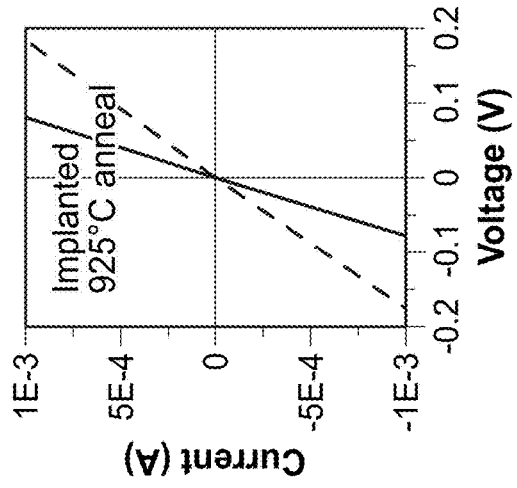
Figure 3B:
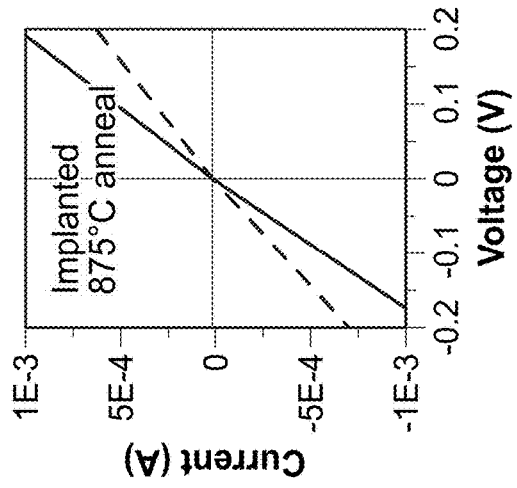

FIGS. 3A-E illustrate current-voltage (I-V) graphs of an un-implanted ohmic contact and the sample 200 of FIG. 2 prepared using various annealing temperatures. Specifically, the graph of FIG. 3A shows I-V characteristics of an ohmic contact substantially similar to the sample 200, but where the layer 102 is un-implanted. As shown, the un-implanted ohmic contact has very little current flow.

The graphs of FIGS. 3B-E show I-V characteristics of the implanted sample 200 after experiencing an activation anneal (e.g., a post-implant anneal) at 875° C., 925° C., 975° C., and 1025° C., respectively. In this example, the total Si implant dosage is about $5E14$ $ions/cm^2$. In the graphs of FIGS. 3B-E, the dashed lines represent I-V characteristics of the sample 200 after a titanium and gold multi-layer stack is deposited, and the solid lines represent I-V characteristics of the sample 200 after the post-metallization 470° C. RTA for 1 minute of the deposited titanium and gold layers. As shown in FIGS. 3B-E, the implanted sample 200 (after experiencing the activation anneal) has current flow, indicating that the implant species are electrically activated.

Additionally, and as shown in FIGS. 3B-E, the post-metallization RTA improves I-V characteristics of the sample 200 in each of the different samples. Specifically, each solid line (representing the sample 200 after the post-metallization RTA) has a greater slope than its corresponding dashed line (representing the sample 200 with no post-metallization RTA). In other words, the slope of each dashed line increases after the post-metallization RTA. This increased slope indicates a decrease in resistance after the post-metallization RTA.

Figure 5:
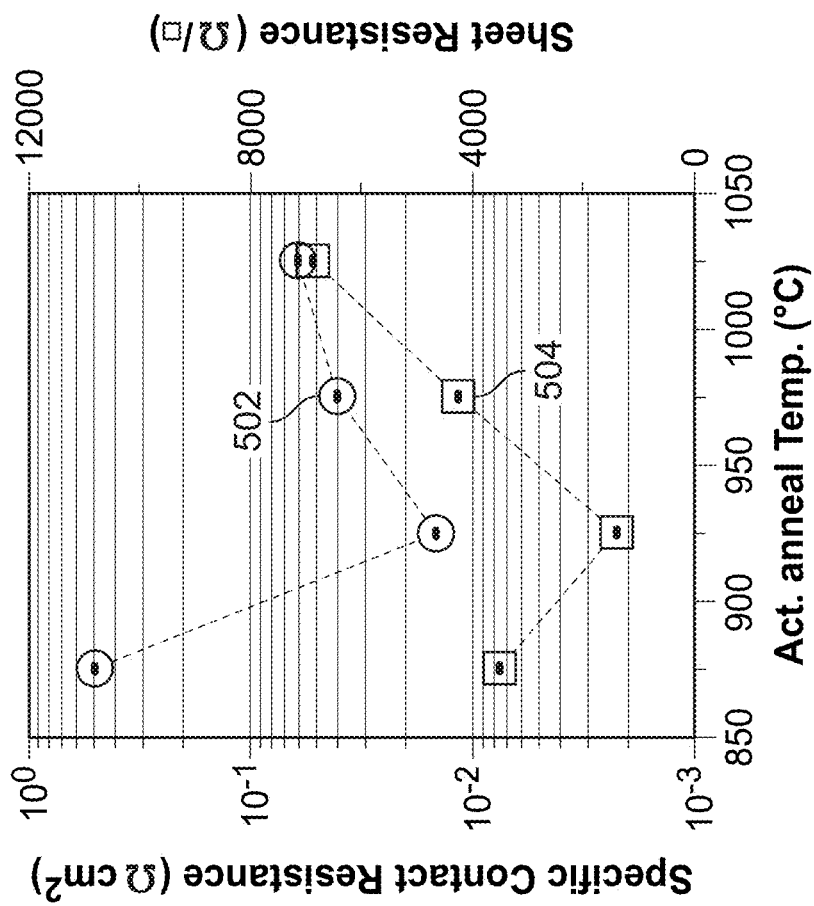
Figure 4:
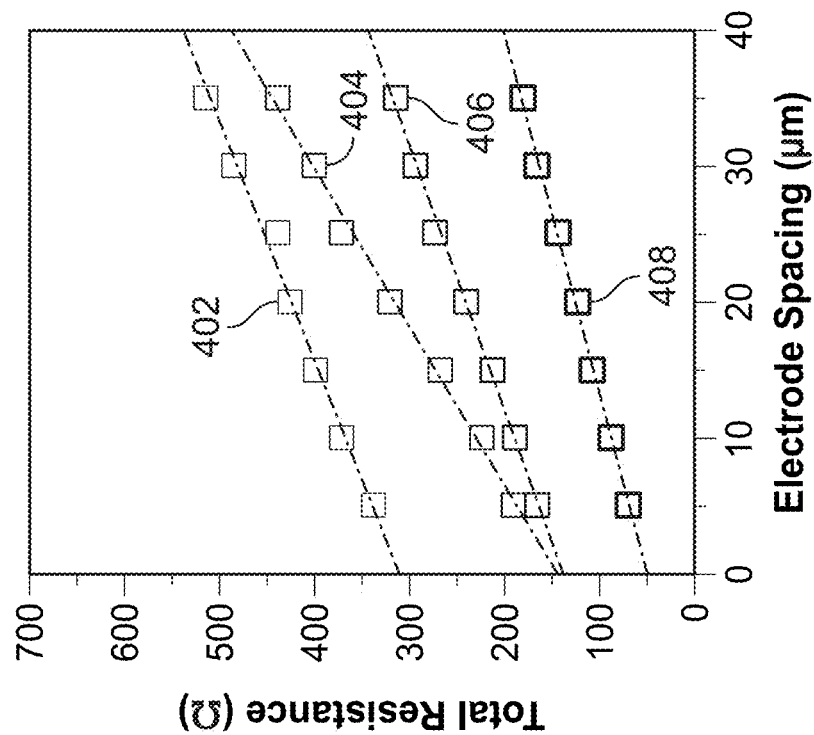

FIGS. 4-5 illustrate graphs showing resistance characteristics of the sample 200 of FIG. 2 at various annealing temperatures. For example, the graph of FIG. 4 includes lines 402, 404, 406, 408 representing the total resistances (Ω) as the spacing between the electrodes 210A, 210B changes for different activation annealing temperatures. Specifically, the line 402 corresponds to an activation annealing temperature of 1025° C., the line 404 corresponds to an activation annealing temperature of 875° C., the line 406 corresponds to an activation annealing temperature of 975° C., and the line 408 corresponds to an activation annealing temperature of 925° C. Additionally, the graph of FIG. 5 includes a line 502 representing a sheet resistance $R_{sh}$ (Ω/sq) at different activation annealing temperatures, and a line 504 representing specific contact resistance $\rho_c$ (Ω-cm$^2$) at the different activation annealing temperatures. Table 1 below includes data extrapolated from the graphs of FIGS. 4-5.

As shown in FIGS. 4-5 and Table 1 below, the lowest values for the total resistances (Ω), the sheet resistance $R_{sh}$, and the contact resistance $\rho_c$ are at the activation annealing temperature of 925° C. As such, the optimum activation anneal window is found to be at around 925° C. Additionally, and as shown, lower and higher activation anneal temperatures cause increases in resistances.

For example, a higher activation anneal temperature (e.g., 1025° C.) may degrade the substrate conductivity/contact performance causing an increase in resistances, and a lower activation anneal temperature may result in an incomplete recovery and insufficient dopant activation causing an increase in resistances. In some examples, electrical performance may begin to degrade when the anneal temperature exceeds, for example, 925° C. For example, and as shown in FIG. 5 and Table 1, when the anneal temperature exceeds 925° C., the contact resistance $\rho_c$ (Ω-cm$^2$) and the sheet resistance $R_{sh}$ (Ω/sq) begin to increase. For instance, the contact resistance $\rho_c$ (Ω-cm$^2$) and the sheet resistance $R_{sh}$ (Ω/sq) of the sample when the anneal temperature is 975° C. are substantially greater than when the anneal temperature is 925° C.

By comparison, electrical performance begins to degrade at a different anneal temperature when using another gallium oxide compound such as the gallium oxide compound disclosed in U.S. Pat. No. 9,611,567 to Sasaki et al. For example, when using the gallium oxide compound disclosed in Sasaki, electrical performance begins to degrade when the anneal temperature reaches 1100° C.

TABLE 1

| Implanted, aluminum-alloyed gallium oxide ($Al_xGa_{2-x}O_3$) | | |
|---|---|---|
| Activation Anneal Temperature (° C.) | Contact Resistance $\rho_c$ (Ω-cm$^2$) | Sheet Resistance Rsh (Ω/sq) |
| 1025 | 5.38E−02 | 7,275.55 |
| 975 | 1.17E−02 | 6,449.44 |
| 925 | 2.20E−03 | 4,639.63 |
| 875 | 7.59E−03 | 10,813.36 |

FIGS. 6A-D illustrate graphs showing the temperature dependent performance of the sample 200 of FIG. 2 after experiencing an activation anneal (e.g., a post-implant anneal) at 875° C., 925° C., 975° C., and 1025° C., respectively. For example, the graph of FIG. 6A shows the total resistance of the sample 200 (annealed at 875° C.) versus electrode spacing (e.g., between the electrodes 210A, 210B) at varying temperatures (e.g., from room temperature RT such as 25° C. to 175° C.). The graphs of FIG. 6B-D show similar data, but where the sample 200 was annealed at 925° C., 975° C., and 1025° C., respectively. While the trend of temperature dependence looks similar across the graphs of FIGS. 6A-D, the sample 200 annealed at 925° C. (FIG. 6B) shows the best performance. For example, and as shown in FIG. 6B, the sample 200 annealed at 925° C. has the lowest total resistance. Additionally, the total resistance of the sample 200 annealed at 925° C. has a small variation as the temperature varies. For example, the resistance of the sample 200 annealed at 925° C. is not very dependent on the temperature in FIG. 6B, whereas in each graph of FIGS. 6A, 6C, and 6D, the resistance varies greatly as temperature changes.

Figure 8:
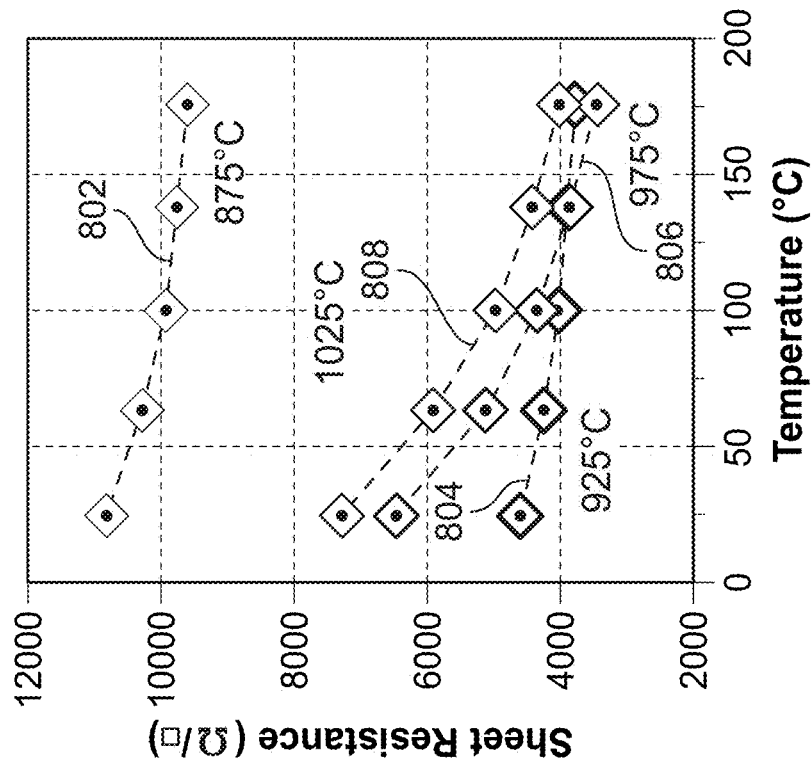
Figure 7:
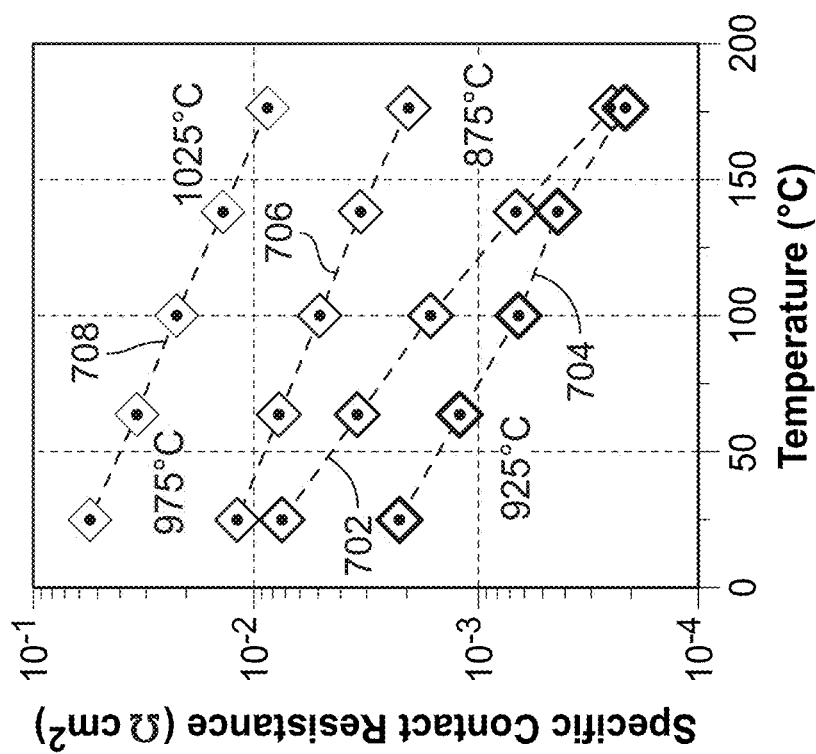

FIGS. 7-8 illustrate graphs showing resistance characteristics of the sample 200 of FIG. 2 as a function of temperature. For example, the graph of FIG. 7 includes lines 702, 704, 706, 708 representing the contact resistance $\rho_c$ (Ω-cm$^2$) of the sample 200 as it is heated from 25° C. (e.g., room temperature) to 175° C. In the example of FIG. 7, the lines 702, 704, 706, 708 correspond to post-implant anneal temperatures of 875° C., 925° C., 975° C., and 1025° C., respectively. Additionally, the graph of FIG. 8 includes lines 802, 804, 806, 808 representing the sheet resistance $R_{sh}$ (Ω/sq) of the sample 200 as it is heated from 25° C. to 175° C. In the example of FIG. 8, the lines 802, 804, 806, 808 correspond to post-implant anneal temperatures of 875° C., 925° C., 975° C., and 1025° C., respectively.

As shown in FIGS. 7-8, the trends of temperature-dependence for the four samples are similar. For example, for each sample, the contact resistance and the sheet resistance decrease as the sample is heated from 25° C. to 175° C. Additionally, and as shown in FIG. 8, the sheet resistance $R_{sh}$ (Ω/sq) of the sample 200 annealed at 875° C. is substantially higher than the other samples. This may be due to a lower efficiency of activation as compared to the other samples.

Figure 10:
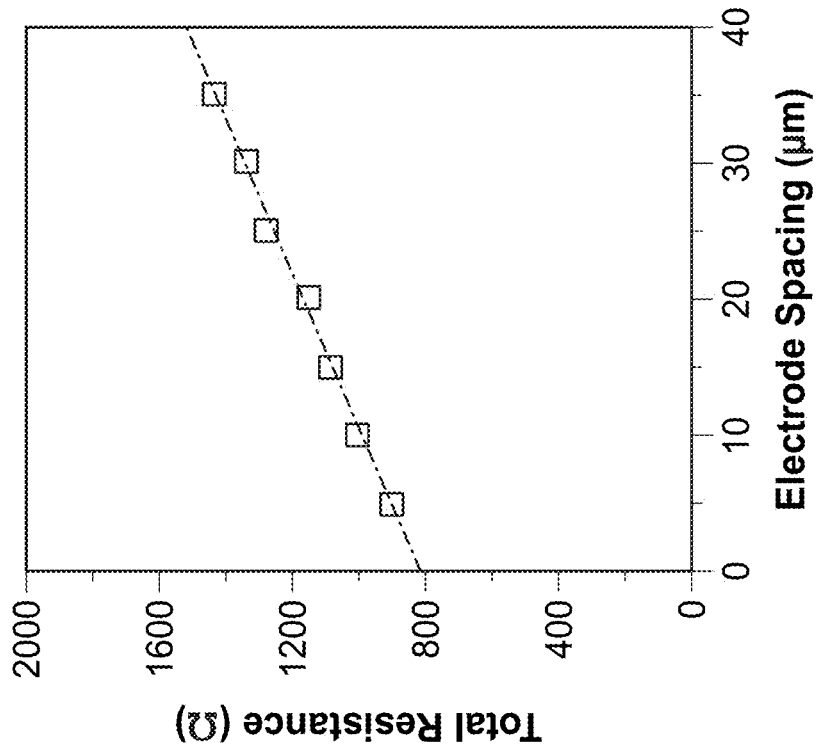
Figure 9:
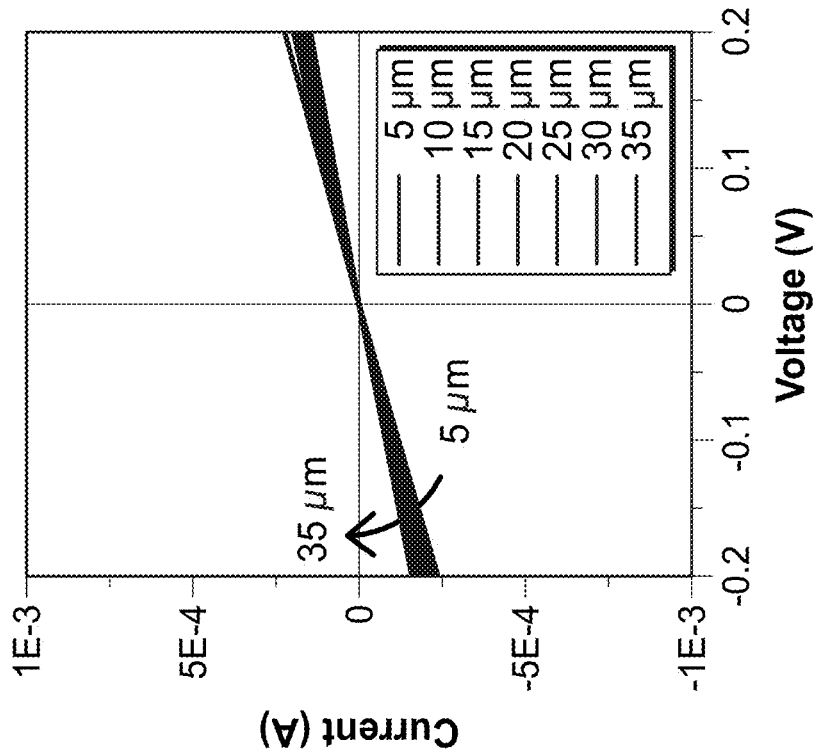

FIG. 9 illustrates a graph showing characteristics of the sample 200 of FIG. 2 having a total Si implant dosage of about 7.5E14 ions/cm$^2$, and a post-implant anneal temperature is 925° C. Specifically, the graph of FIG. 9 shows I-V characteristics of the sample 200, and includes lines representing electrode spacing of 5 μm, 10 μm, 15 μm, 20 μm, 25 μm, 30 μm, 45 μm. The graph of FIG. 10 shows the total resistance of the sample 200 as electrode spacing changes. Table 2 below includes data extrapolated from the graphs of FIGS. 9-10.

Figure 3C:
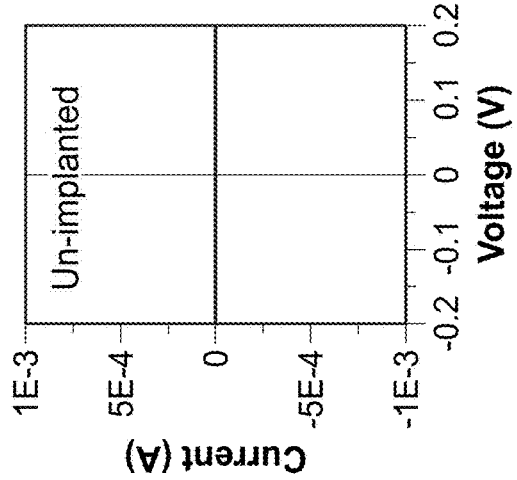
Figure 3D:
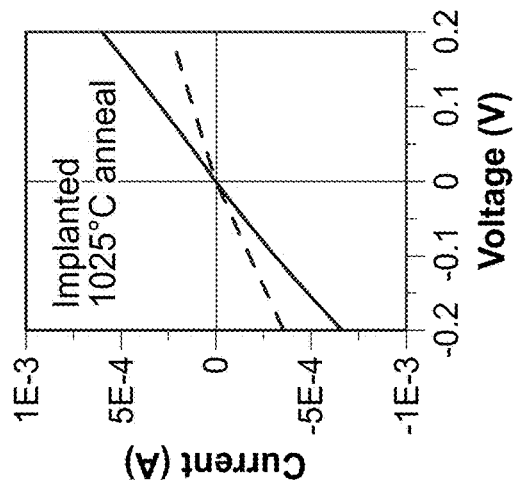
Figure 3E:
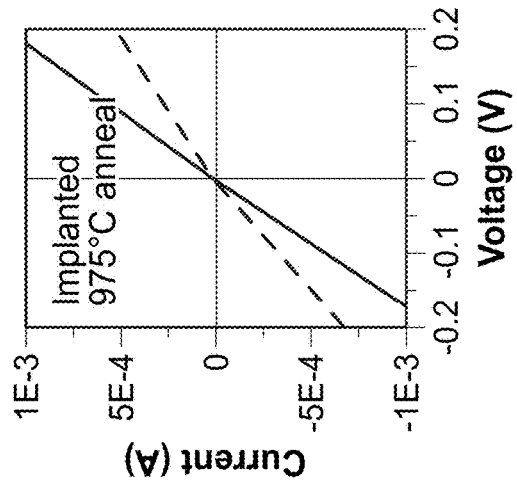

As shown in FIG. 9, the lines appear to have a small slope, particularly when compared to I-V characteristics lines of FIG. 3C. This would suggest that the implanted Si ions in the example of FIG. 9 (e.g., a total Si implant dosage of about 7.5E14 ions/cm$^2$) were only partially activated.

Additionally, and as shown in FIG. 10 and Table 2 below, the contact resistance and the sheet resistance are both substantially high. For example, the contact resistance and the sheet resistance are much higher as compared to other samples such as the samples of Table 1 above. This increased contact resistance and sheet resistance suggest that a low efficiency of activation was achieved, an incomplete and/or insufficient crystalline damage recovery was achieved, and/or a presence of residual defects from the high-dose implant (7.5E14 ions/cm$^2$).

TABLE 2

Implanted, $Al_xGa_{2-x}O_3$, 7.5E14 ions/cm$^2$, 925° C.

| Contact Resistance $\rho_c$ ($\Omega$-cm$^2$) | Sheet Resistance Rsh ($\Omega$/sq) |
|---|---|
| 1.26E−01 | 21,191.93 |

Figure 11B:
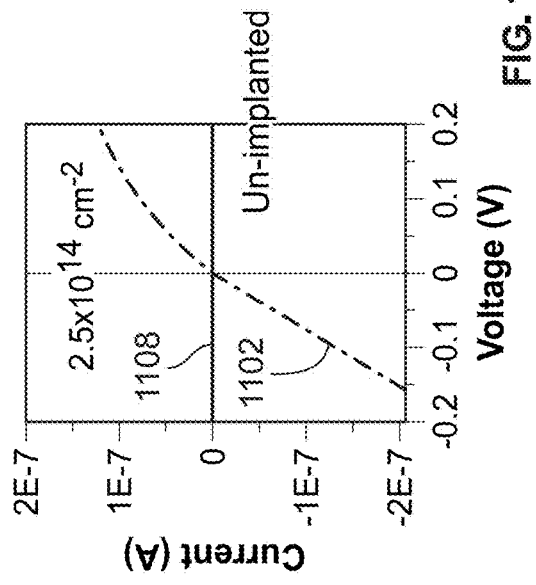
Figure 11D:
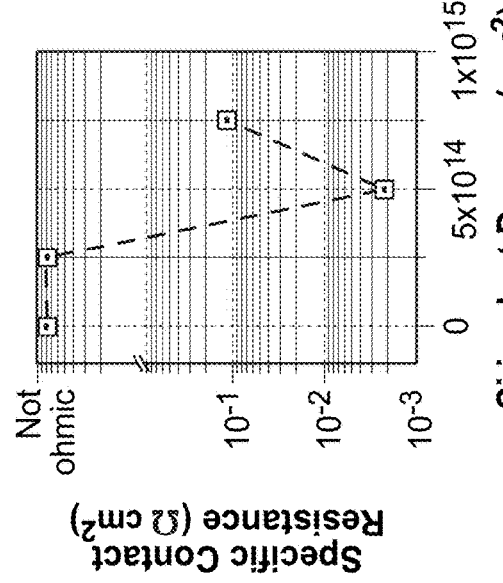
Figure 11A:
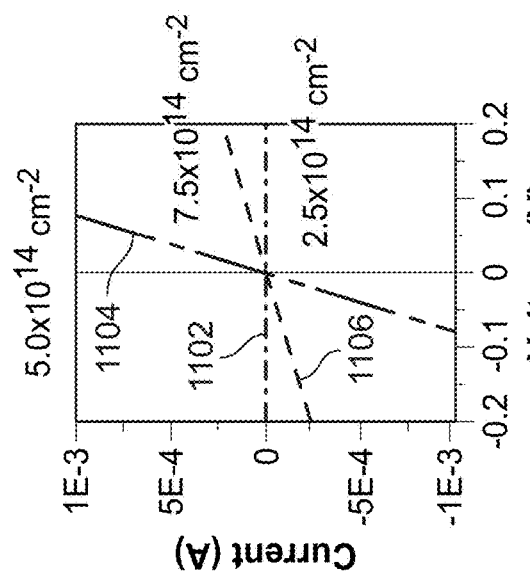
Figure 11C:
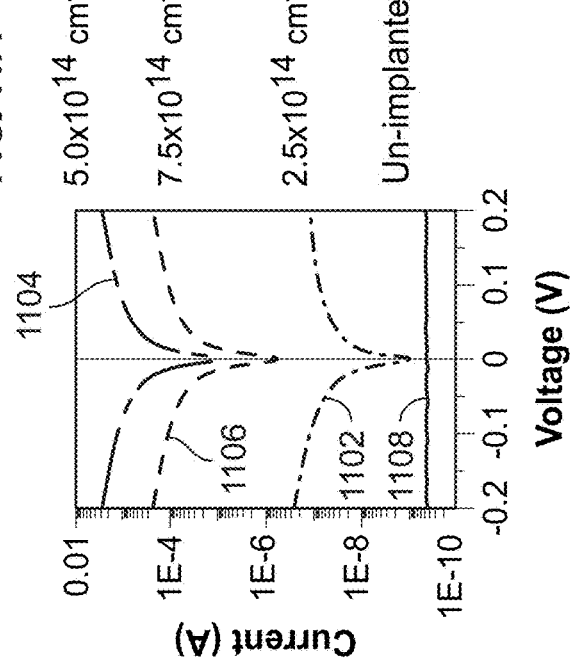

FIGS. 11A-C illustrate graphs showing I-V characteristics of the sample 200 of FIG. 2 having different total Si implant dosages, and FIG. 11D illustrates a graph showing the contact resistance of the sample 200 as a function of a total Si implant dosage. Table 3 below includes data extrapolated from the graphs of FIGS. 11A-D.

For example, the graph of FIG. 11A includes lines 1102, 1104, 1106 representing I-V characteristics of the sample 200 having total Si implant dosages of 2.5E14 ions/cm$^2$, 5E14 ions/cm$^2$, and 7.5E14 ions/cm$^2$, respectively. The graphs of FIGS. 11B-C are similar to the graph of FIG. 11A, but where the current (Y-axis) is magnified to focus on different ranges. For example, the graph of FIG. 11B includes the line 1102 of FIG. 11A, and a line 1108 representing I-V characteristics of an un-implanted sample. The graph of FIG. 11C includes the lines 1102, 1104, 1106 of FIG. 11A and 1108 of FIG. 11B.

As shown in FIGS. 11A-D and Table 3 below, the total Si implant dosage of about 5E14 ions/cm$^2$ with a post-implant anneal temperature of 925° C. provides the most optimal results with respect to electrical performance.

In some instances, electrical performance of an ohmic contact formed on an implanted Al-alloyed gallium oxide crystal structure may began to degrade when the total implant dosage exceeds, for example, 5E14 ions/cm$^2$. For example, and as shown in FIG. 11D and Table 3, when the total implant dosage exceeds 5E14 ions/cm$^2$, the contact resistance $\rho_c$ ($\Omega$-cm$^2$) and the sheet resistance $R_{sh}$ ($\Omega$/sq) begin to increase. For instance, the contact resistance $\rho_c$ ($\Omega$-cm$^2$) and the sheet resistance $R_{sh}$ ($\Omega$/sq) of the sample when the total implant dosage is 7.5E14 ions/cm$^2$ (resulting in an implantation concentration of 9E19 cm$^{-3}$) are substantially greater than when the total implant dosage is 5E14 ions/cm$^2$ (resulting in an implantation concentration of 6E19 cm$^{-3}$).

By comparison, electrical performance of an ohmic contact begins to degrade at a different total implant dosage and concentration when the ohmic contact is formed on another gallium oxide compound such as the gallium oxide compound disclosed in U.S. Pat. No. 9,611,567 to Sasaki et al. For example, when using the gallium oxide compound disclosed in Sasaki, electrical performance of the ohmic contact begins to degrade when the total implant dosage reaches 2E15 ions/cm$^2$ (resulting in an implantation concentration of 1E20 cm$^{-3}$).

TABLE 3

Implanted, $Al_xGa_{2-x}O_3$ (post RTA)

| Implant Dosage (ions/cm$^2$) | Act. Anneal Temperature (° C.) | Ohmic | Contact Resistance $\rho_c$ ($\Omega$-cm$^2$) | Sheet Resistance $R_{sh}$ ($\Omega$/sq) |
|---|---|---|---|---|
| none | none | No | — | — |
| 2.5E14 | 925 | No | — | — |
| 5.0E14 | 925 | Yes | 2.20E−03 | 4,639.63 |
| 7.5E14 | 925 | Yes | 1.26E−01 | 21,191.93 |

FIGS. 12A-B illustrate graphs showing simulated and measured data relating to the implantation concentration as a function of depth. In the examples of FIGS. 12A-B, the x-axis values (depths) are representative values.

For example, the graph of FIG. 12A shows a Si concentration of implanted, $Al_xGa_{2-x}O_3$ samples as a function of depth for various post-implant anneal temperatures, and the graph of FIG. 12B shows an Al concentration of implanted, $Al_xGa_{2-x}O_3$ samples as a function of depth for various post-implant anneal temperatures. In the graph of FIG. 12A, the dashed lines represent expected distribution of Si for each of three separate implant energies/doses, as well as the expected total distribution (summing all three implants), and the solid lines represent measured data of samples having no post-implant anneal, a post-implant anneal of 925° C., and a post-implant anneal of 1025° C. The implants were designed to create a roughly 80 nm implanted Si box-profile (e.g., a box from about 30 nm to 80 nm depth, with 6.0E19 cm$^{-3}$ Si concentration). In the graph of FIG. 12B, the solid lines represent measured data of Al concentration of the $Al_xGa_{2-x}O_3$ samples having no post-implant anneal, a post-implant anneal of 925° C., and a post-implant anneal of 1025° C. As shown in FIGS. 12A-B, the Si concentration lines appear substantially similar, and the Al concentration lines appear substantially similar.

FIGS. 12C-E each illustrate an atomic force microscopy (AFM) image of the surface topography of a sample, and a bar with color gradation to indicate the surface profile height. In the examples of FIGS. 12C-E, the darkest areas in the images are used as references, the lightest areas are 20 nm in height, and the magnification of the images are the same.

The AFM images of FIGS. 12C-E are of different samples. For example, FIG. 12C is an AFM image of an un-implanted aluminum-alloyed gallium oxide material, FIG. 12D is an AFM image of an implanted aluminum-alloyed gallium oxide material (with no annealing), and FIG. 12E is an AFM image of an implanted aluminum-alloyed gallium oxide material annealed at 925° C. In FIGS. 12D-E, the aluminum-alloyed gallium oxide material includes a total implant dosage of 5E14 ions/cm$^2$, resulting in a concentration of 6E19 cm$^{-3}$.

As shown in FIGS. 12C-E, root mean square (RMS) roughness values of the different samples are provided. Each RMS value represents a standard deviation of the profile height. The RMS roughness values are 2.8 nm for the un-implanted aluminum-alloyed gallium oxide material shown in FIG. 12C, 2.65 nm for the implanted aluminum-alloyed gallium oxide material shown in FIG. 12D, and 2.75 nm for the implanted aluminum-alloyed gallium oxide material shown in FIG. 12E.

FIGS. 13-26 illustrate various embodiments of semiconductor devices each including an implanted, aluminum-alloyed gallium oxide ($Al_xGa_{2-x}O_3$) crystal structure as disclosed herein. In the examples of FIGS. 13-26, the implanted, aluminum-alloyed gallium oxide material may be formed by implanting a Group IV element (e.g., Si, etc.) as a donor impurity into the aluminum-alloyed gallium oxide material with an ion implantation process, and then annealing the implanted material to activate the Group IV element to form an electrically conductive region, as explained herein. In such examples, the concentration of ion donors may be controlled to optimize desired parameters associated with the devices. For example, and as explained above, desired parameters may be achieved when an implant dosage of about 5E14 ions/cm$^2$ and/or a post implant anneal temperature of about 925° C. are employed.

In some examples of the devices in FIGS. 13-26, contacts may be formed on the implanted, aluminum-alloyed gallium oxide material. For example, one or more of the contacts may be formed by etching (e.g., reactive-ion etching, wet chemical etching, ion milling, etc.) at least a portion of the implanted $Al_xGa_{2-x}O_3$ material to form an etched region, depositing one or more electrically conductive materials on at least a portion of the etched region to form the ohmic contact, and (optionally) annealing the electrically conductive material(s) at a suitable temperature for a suitable period of time in a suitable environment, as explained herein. In some examples, one or more of the contacts may be formed without etching if desired.

For example, the embodiments of FIGS. 13-17 each include a substrate, two layers of aluminum-alloyed gallium oxide ($Al_xGa_{2-x}O_3$) material (e.g., a crystal structure), a layer of gallium oxide ($Ga_2O_3$) material (e.g., a crystal structure), two opposing regions 1000 (shown with diagonal hatching) of a Group IV ion implant, and electrodes (e.g., a source(S) electrode, a gate (G) electrode, and a drain (D) electrode). In the embodiments of FIGS. 13-17, a gallium oxide layer is positioned between the two aluminum-alloyed gallium oxide layers.

The substrate shown in FIGS. 13-17 may include, for example, a gallium oxide ($Ga_2O_3$) material, an aluminum-alloyed gallium oxide ($Al_xGa_{2-x}O_3$) material, a gallium nitride (GaN), a silicon carbide (SiC), a diamond (C) material, or another suitable material. Preferably, an upper layer of the substrate is not highly electrically conductive.

In the embodiments of FIGS. 13-17, the Group IV ion implant may include any suitable Group IV element such as Si, Sn, Ge, etc. as explained above. Additionally, the implanted regions 1000 are n++ (e.g., degenerately doped) regions.

The depth of the implanted regions 1000 may vary as desired. For example, the implanted regions 1000 may extend into the gallium oxide layer as shown in FIGS. 13A, 14A, 14B, 15A, 16A, 17A. In other examples, the implanted regions 1000 may extend into the lower aluminum-alloyed gallium oxide layer as shown in FIGS. 13C, 14C, 15C, 16C, 17C. In still other examples, the implanted regions 1000 may extend to the substrate as shown in FIGS. 13B, 15B, 16B, 17B. Although not shown, the implanted regions 1000 in any one of the embodiments of FIGS. 14A-C may extend into to the substrate if desired.

As shown in FIGS. 13-17, the source(S) electrode is positioned above one of the implanted regions 1000, the drain (D) electrode is positioned above the other implanted region 1000, and the gate (G) electrode is positioned above the upper aluminum-alloyed gallium oxide layer. In such examples, the source(S) and drain (D) electrodes form ohmic contacts, and the gate (G) electrode forms a Schottky contact.

The embodiments of FIGS. 13-17 may be any suitable type of device. For example, the embodiments of FIGS. 13A-C may be a high-electron-mobility transistor (HEMT), or sometimes called a modulation-doped field-effect transistor (MODFET). Additionally, the embodiments of FIGS. 14A-C may be a HEMT having a pseudo delta doped layer formed by ion implant, epitaxy, etc. In the embodiments of FIGS. 14A-C, the delta doped regions are shown with a dashed line 1002 in the upper aluminum-alloyed gallium oxide layer and/or a dashed line 1004 in the lower aluminum-alloyed gallium oxide layer. Further, the embodiments of FIGS. 15A-C may be a HEMT having a metal-insulator-semiconductor (MIS) gate. For example, in each embodiment of FIGS. 15A-C, a gate insulator (e.g., a gate oxide OX layer as shown in FIGS. 15A-C or another suitable dielectric insulator) is positioned between the gate (G) electrode and the upper aluminum-alloyed gallium oxide layer (e.g., a channel connecting the source(S) and drain (D) electrodes).

Figure 16A:
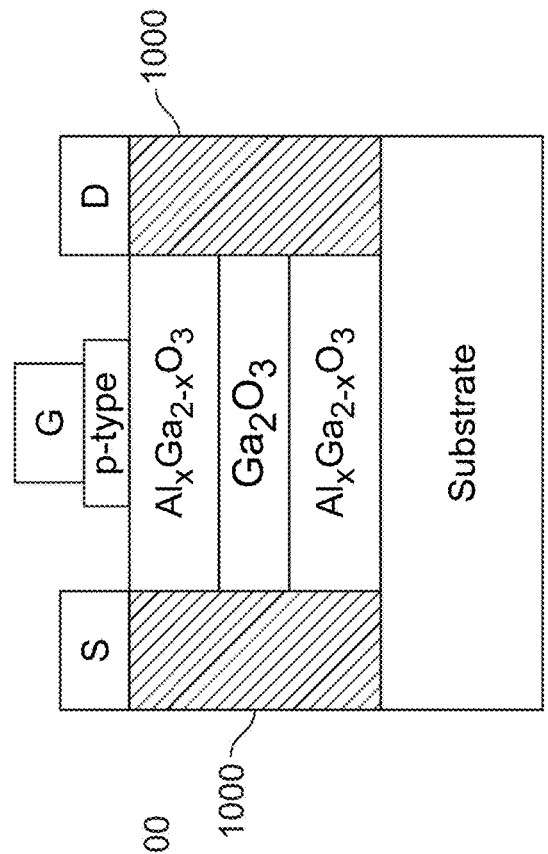
Figure 16B:
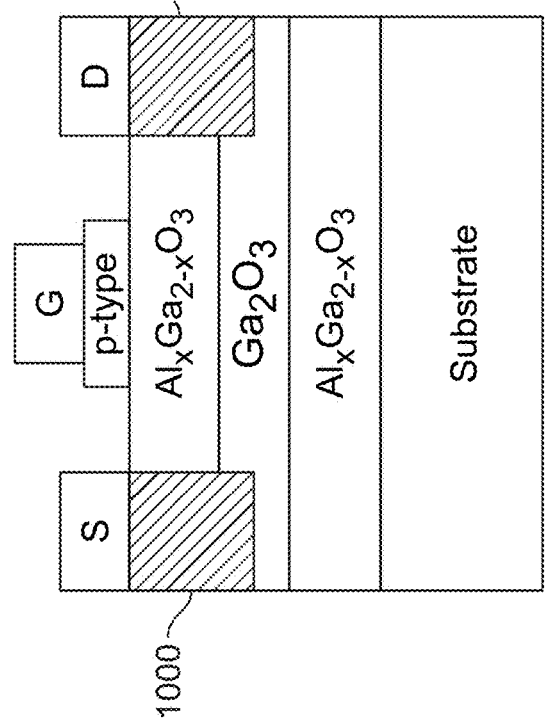
Figure 16C:
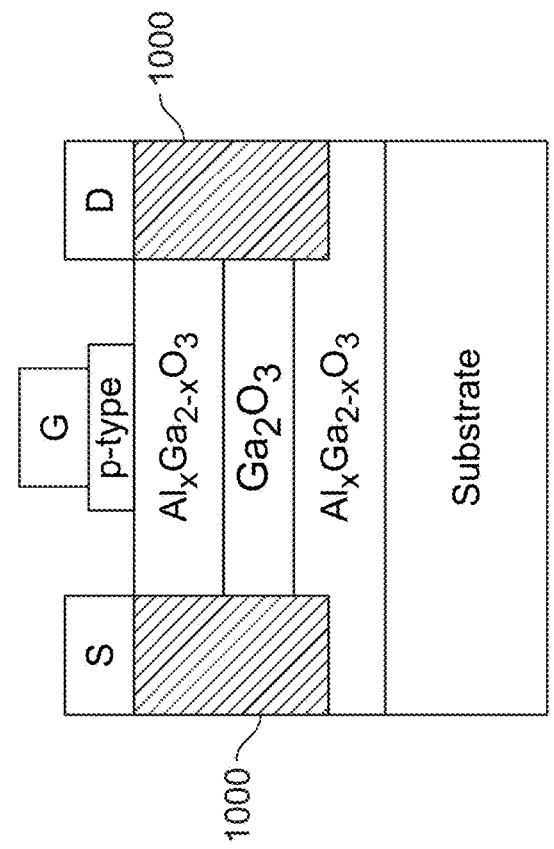

In FIGS. 16A-C and 17A-C, the embodiments may be a HEMT having a junction field-effect transistor (JFET) gate. For example, the JFET gates of FIGS. 16A-C are top JFET gates. Specifically, in each embodiment of FIGS. 16A-C, a p-type layer is positioned between the upper aluminum-alloyed gallium oxide layer and the gate (G) electrode. In FIGS. 17A-C, the JFET gates of FIGS. 16A-C are buried. Specifically, in each embodiment of FIGS. 17A-C, a p-type layer is buried in the upper aluminum-alloyed gallium oxide layer, and below the gate (G) electrode. In the embodiments of FIGS. 16A-C and 17A-C, the p-type layer may be, for example, a gallium oxide layer doped with any suitable ion implant such as a magnesium (Mg) ion implant, a beryllium (Be) ion implant, a nitrogen (N) ion implant, etc.

Figure 18A:
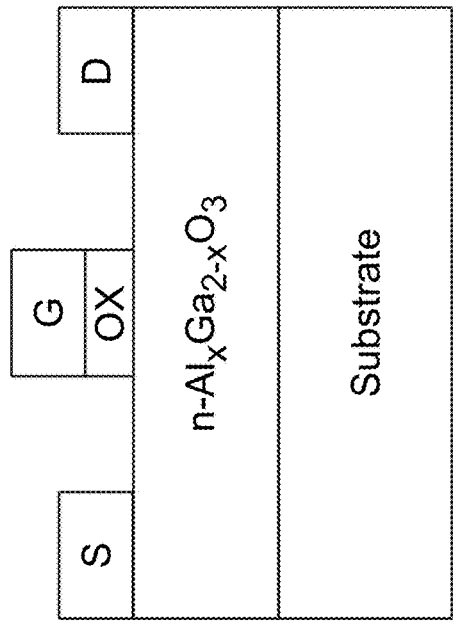
Figure 18B:
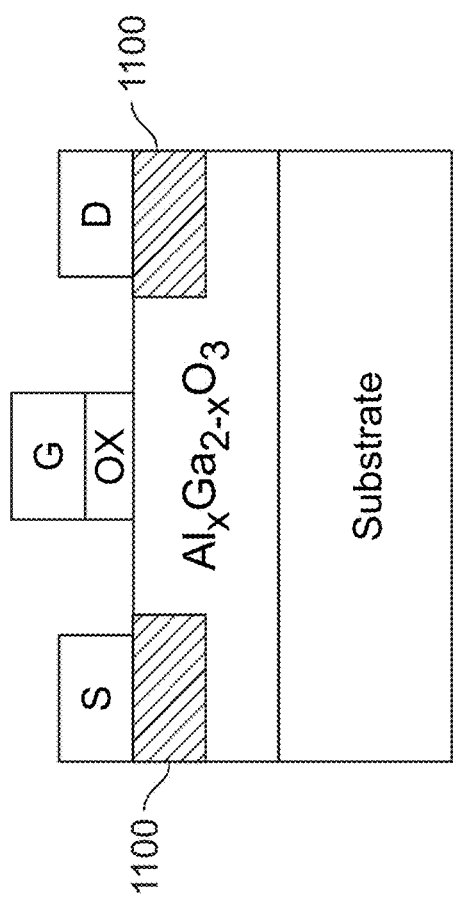
Figure 18C:
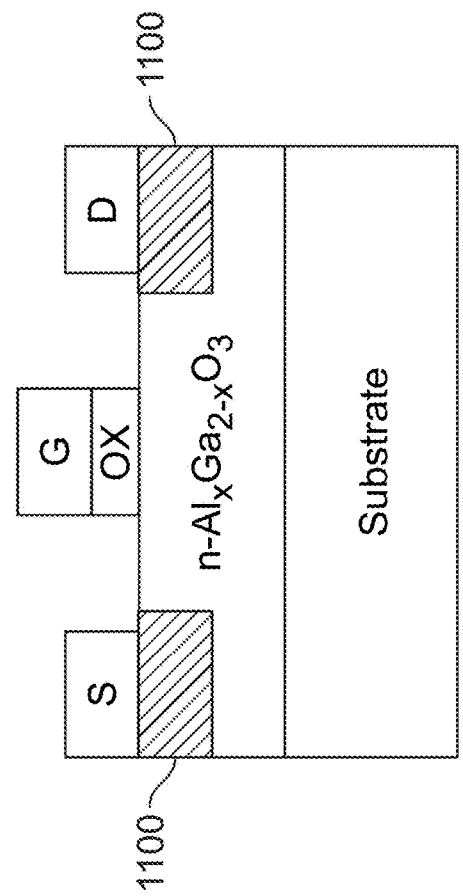

The embodiments of FIGS. 18A-C each include a substrate, a layer of aluminum-alloyed gallium oxide ($Al_xGa_{2-x}O_3$) material positioned on the substrate, electrodes (e.g., source(S), gate (G), and drain (D) electrodes) positioned above the aluminum-alloyed gallium oxide layer, and a gate insulator layer positioned between the gate (G) electrode and the aluminum-alloyed gallium oxide layer. The substrate of FIGS. 18A-C may be similar to the substrates of FIGS. 13-17. In FIGS. 18A-C, each embodiment is an $Al_xGa_{2-x}O_3$ metal-insulator-semiconductor field-effect transistor (MISFET).

As shown in FIGS. 18A and C, each embodiment includes two opposing regions 1100 (shown with diagonal hatching) of a Group IV ion implant as explained above. Each implanted region 1100 is an n++ region and extends into the aluminum-alloyed gallium oxide layer. In FIGS. 18B and C, each aluminum-alloyed gallium oxide layer is doped n-type (e.g., a controlled, non-degenerate doping level) with a Group IV (e.g., Si, etc.) ion implant. In other examples, other doping techniques (diffusion, in situ doping during epitaxy, etc.) may be employed. For example, in FIG. 18C, the aluminum-alloyed gallium oxide layer may be doped by diffusion or doping during epitaxy.

Figures 19A, 19B, 19C:
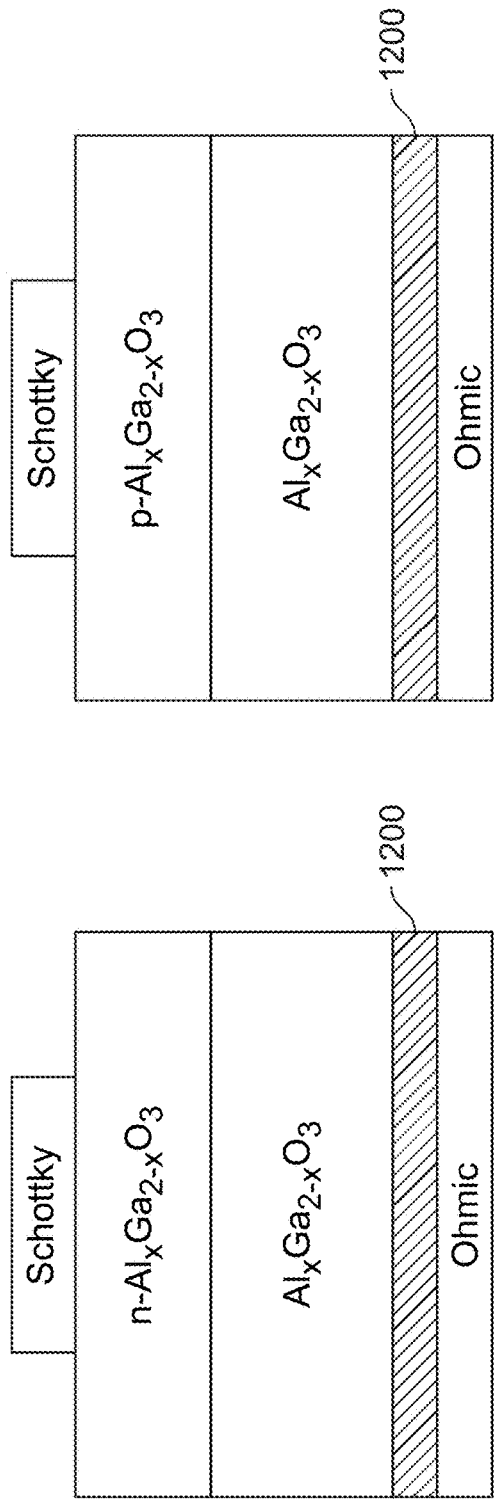

The embodiments of FIGS. 19A-C are $Al_xGa_{2-x}O_3$ Schottky devices arranged in a vertical configuration. Additionally, the embodiment of FIG. 19C is arranged with junction terminations.

As shown, each embodiment includes two layers of aluminum-alloyed gallium oxide ($Al_xGa_{2-x}O_3$) material, and a region 1200 (shown with diagonal hatching) of a Group IV (e.g., Si, etc.) ion implant as explained above.

Each implanted region is an n++ region and extends into the lower aluminum-alloyed gallium oxide layer.

In FIGS. 19A-C, each upper aluminum-alloyed gallium oxide layer is doped n-type and/or p-type. For example, the upper aluminum-alloyed gallium oxide layer of FIG. 19A may be doped n-type (e.g., a controlled, non-degenerate doping level) with a Group IV (e.g., Si, etc.) by ion implant, diffusion, doping during epitaxy, etc., and the upper aluminum-alloyed gallium oxide layer of FIG. 19B may be doped p-type by ion implant (e.g., a magnesium (Mg) ion implant, a beryllium (Be) ion implant, a nitrogen (N) ion implant, etc.), diffusion, doping during epitaxy, etc. Additionally, opposing regions of the upper aluminum-alloyed gallium oxide layer in FIG. 19C are doped p-type with a magnesium (Mg) ion implant, a beryllium (Be) ion implant, a nitrogen (N) ion implant, etc., and a middle region (e.g., between the opposing p-type regions) is doped n-type with a Group IV ion implant. In FIG. 19C, the upper n-type and p-type layers could also be achieved by diffusion or doping during epitaxy.

As shown in FIGS. 19A-C, each embodiment includes opposing electrodes. For example, each embodiment includes an electrode (e.g., a Schottky contact) positioned on the upper aluminum-alloyed gallium oxide layer, and an electrode (e.g., an ohmic contact) positioned on the implanted region 1200 of the lower aluminum-alloyed gallium oxide layer.

The embodiments of FIGS. 20A-C are $Al_xGa_{2-x}O_3$ Schottky devices arranged in a lateral configuration. FIG. 20B illustrates a top view of the embodiment of FIG. 20A. Although FIG. 20B shows the embodiment of FIG. 20A as having a circular shape, it should be apparent that the shape may be any other suitable shape such as hexagon, square, etc. As shown, each embodiment includes a substrate, a layer of aluminum-alloyed gallium oxide ($Al_xGa_{2-x}O_3$) material and opposing regions 1300 (shown with diagonal hatching) of a Group IV (e.g., Si, etc.) ion implant as explained above. Each implanted region 1300 is an n++ region and extends into the aluminum-alloyed gallium oxide layer. As shown, the aluminum-alloyed gallium oxide layer of FIG. 20C is doped n-type with a Group IV (e.g., Si, etc.) by ion implant, diffusion, in situ doping during epitaxy, etc. as explained above.

As shown in FIGS. 20A-C, each embodiment includes three electrodes spaced laterally across the upper aluminum-alloyed gallium oxide layer. Specifically, each embodiment includes two opposing electrodes (e.g., ohmic contacts), and a middle electrode (e.g., a Schottky contact) positioned between the two opposing electrodes. The opposing electrodes are positioned on the implanted regions 1300.

Figure 21A:
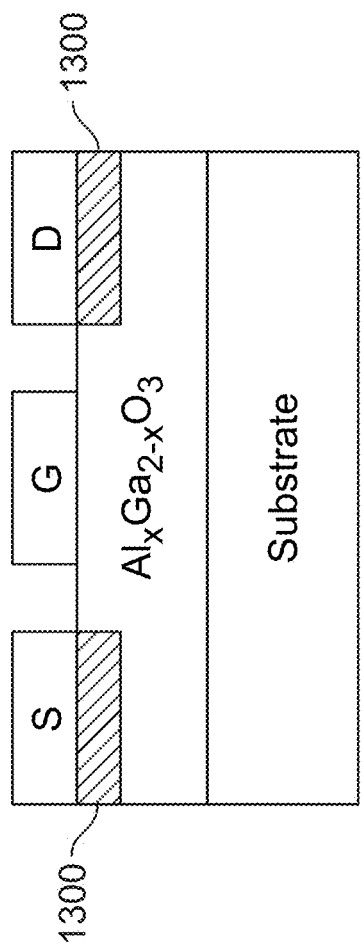
Figure 21B:
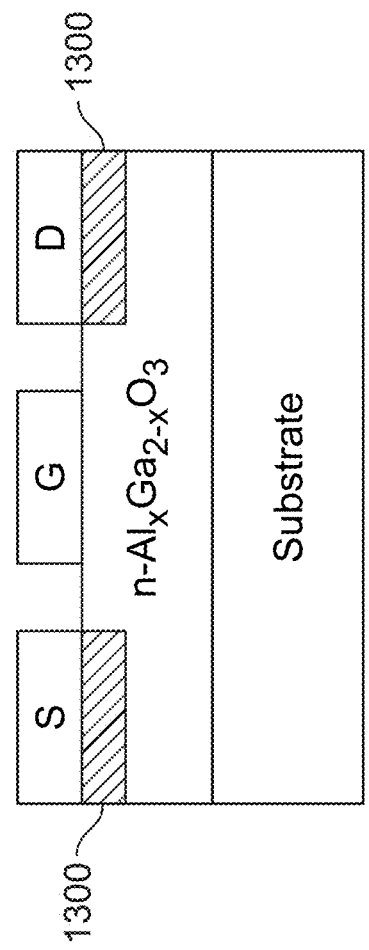

The embodiments of FIGS. 21A-B are $Al_xGa_{2-x}O_3$ MESFET devices arranged in a lateral configuration. The embodiments of FIG. 21A-B are similar to the embodiments of FIGS. 20A and C, but where the opposing electrodes are source(S) and drain (D) electrodes positioned on the implanted regions 1300 and the middle electrode is a gate (G) electrode, and the top views of the embodiments of FIGS. 21A-B are different than that shown in FIG. 20B.

The embodiments of FIGS. 22A-B are $Al_xGa_{2-x}O_3$ FinFET devices. FIG. 22C illustrates an example isometric view of a top portion of the $Al_xGa_{2-x}O_3$ FinFET devices in FIGS. 22A-B. As shown, the embodiment of FIG. 22A includes a layer of aluminum-alloyed gallium oxide ($Al_xGa_{2-x}O_3$) material, insulator layers (e.g., gate oxide OX layers, etc.), and opposing regions 1400, 1402 (shown with diagonal hatching) of a Group IV (e.g., Si, etc.) ion implant as explained above. Each opposing implanted region 1400, 1402 is an n++ region and extends into the aluminum-alloyed gallium oxide layer. As an alternate embodiment, one of the n++ regions may be created by ion implant whereas the other may be created by diffusion or doping during epitaxy.

The embodiment of FIG. 22B is similar to the embodiment of FIG. 22A, but includes a layer of aluminum-alloyed gallium oxide, non-degenerately doped n-type with a Group IV (e.g., Si, etc.) by ion implant, diffusion, doping during epitaxy, etc. as explained above. In FIG. 22B, the top implanted n++ region 1402 extends into the n-type aluminum-alloyed gallium oxide layer, and the other bottom, implanted region 1400 extends into the aluminum-alloyed gallium oxide layer. As an alternate embodiment, either the top n++ region 1402 or the bottom n++ region 1400 may be created by ion implant whereas the other may be created by diffusion or doping during epitaxy.

As shown in FIGS. 22A-C, each embodiment includes multiple electrodes. Specifically, each embodiment includes a source(S) electrode positioned on the top n++ region 1402, two opposing gate (G) electrodes positioned on the gate insulator layers (e.g., oxide OX layers, etc.), and a drain (D) electrode positioned on the bottom n++ region 1400, where one or both n++ regions 1400, 1402 may be formed by ion implant.

The embodiment of FIG. 23 is an $Al_xGa_{2-x}O_3$, current aperture vertical electron transistor (CAVET). The embodiment of FIG. 23 includes a layer of unintentionally doped (UID), aluminum-alloyed gallium oxide ($Al_xGa_{2-x}O_3$) material, a layer of aluminum-alloyed gallium oxide doped n-type with a Group IV (e.g., Si, etc.) by ion implant, diffusion, doping during epitaxy, etc., two current blocking layers (CBLs), a gate insulator layer (e.g., an oxide OX layer, etc.), and three regions 1500, 1502, 1504 (shown with diagonal hatching) of a Group IV (e.g. Si, etc.) ion implant as explained above. Each current blocking layer CBL may include a magnesium (Mg) ion implant, a beryllium (Be) ion implant, a nitrogen (N) ion implant, etc. One or both current blocking layers CBL may alternately be formed by, for example, doping during epitaxy.

In FIG. 23, each implanted region 1500, 1502, 1504 is an n++ region. Additionally, and as shown in FIG. 23, two of the implanted regions 1500, 1502 extend into the n-type aluminum-alloyed gallium oxide layer, and the other implanted region 1504 extends into a bottom portion of the UID, aluminum-alloyed gallium oxide layer. As an alternate embodiment, either the top n++ regions 1500, 1502 or the bottom n++ region 1504 may be created by ion implant whereas the other may be created by diffusion or doping during epitaxy.

As shown in FIG. 23, the embodiment includes multiple electrodes. Specifically, the embodiment includes a gate (G) electrode positioned on the gate insulator layer (e.g., an oxide OX layer, etc.), two source(S) electrodes positioned on the top n++ regions 1500, 1502, and a drain (D) electrode positioned on the bottom n++ region 1504, where one or more of the n++ regions 1500, 1502, 1504 may be formed by ion implant.

Additionally, although the embodiment of FIG. 23 is shown as including a stack of the gate (G) electrode and the gate insulator layer (e.g., an oxide OX layer, etc.), other arrangements may be employed. For example, the stack of the gate (G) electrode and the gate insulator layer may be replaced with another suitable electrode such as a Schottky contact.

Figure 24B:
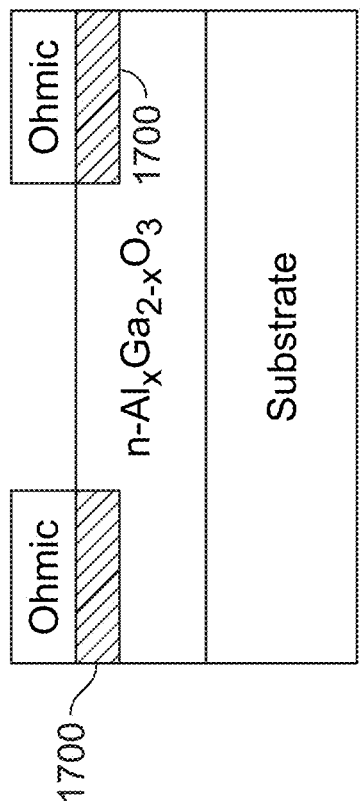
Figure 24A:
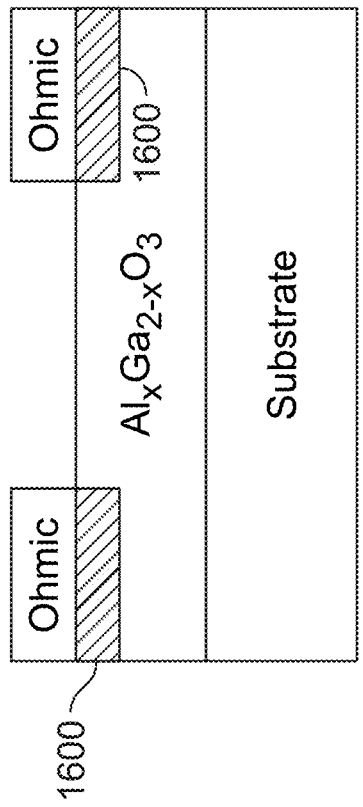
Figure 25B:
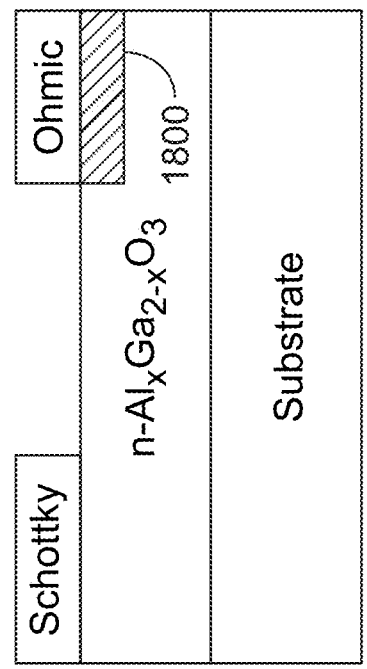
Figure 25A:
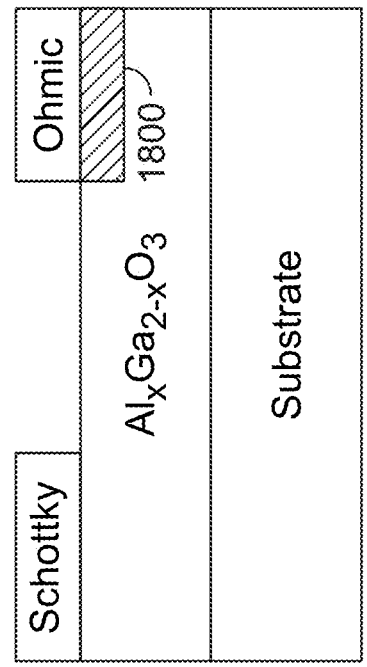
Figure 26:
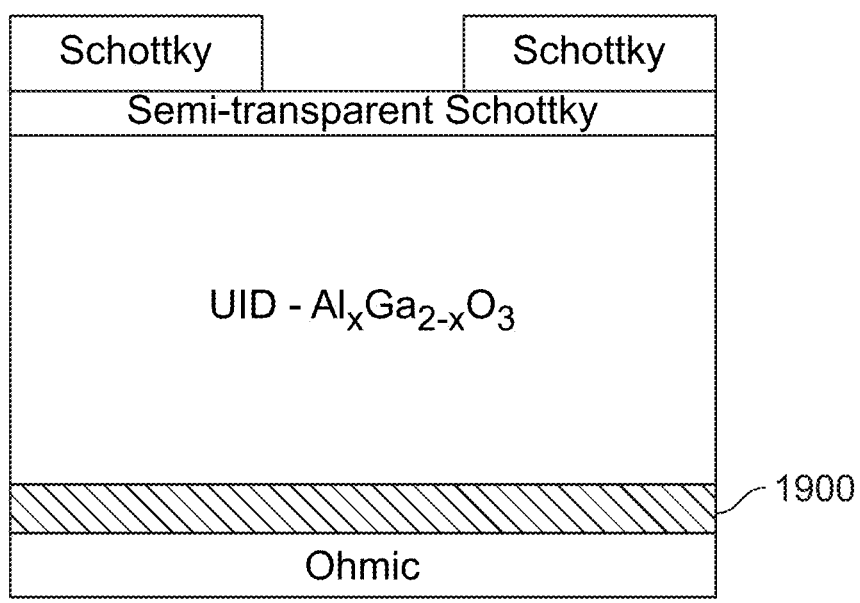

FIGS. 24-26 illustrate various embodiments of solar blind photoconductors and photodetectors having different configurations. For example, the embodiments of FIGS. 24A-B are solar blind photoconductors having lateral metal-semiconductor-metal (MSM) ohmic structures, the embodiments of FIGS. 25A-B are solar blind photodetectors having lateral Schottky structures, and the embodiment of FIG. 26 is a solar blind photodetector having a vertical Schottky structure.

Specifically, the lateral MSM ohmic structure of FIG. 24A includes a substrate, a layer of aluminum-alloyed gallium oxide ($Al_xGa_{2-x}O_3$) material, two opposing regions 1600 (shown with diagonal hatching) of a Group IV ion implant, and ohmic contacts formed on the implanted regions 1600. The lateral MSM ohmic structure of FIG. 24B is similar to the lateral MSM ohmic structure of FIG. 24A, but includes a layer of aluminum-alloyed gallium oxide ($Al_xGa_{2-x}O_3$) doped n-type. Specifically, the lateral MSM ohmic structure of FIG. 24B includes a substrate, the layer of aluminum-alloyed gallium oxide ($Al_xGa_{2-x}O_3$) doped n-type, two opposing regions 1700 (shown with diagonal hatching) of a Group IV ion implant, and ohmic contacts formed on the implanted regions 1700.

The lateral Schottky structure of FIG. 25A includes a substrate, a layer of aluminum-alloyed gallium oxide ($Al_xGa_{2-x}O_3$) material, a region 1800 (shown with diagonal hatching) of a Group IV ion implant, an ohmic contact formed on the implanted region 1800, and a Schottky contact formed on the aluminum-alloyed gallium oxide layer. As shown in FIG. 25A, the ohmic contact and the Schottky contact are formed along opposing ends of one side of the aluminum-alloyed gallium oxide layer. The lateral Schottky structure of FIG. 25B is similar to the lateral Schottky structure of FIG. 25A, but includes a layer of aluminum-alloyed gallium oxide ($Al_xGa_{2-x}O_3$) doped n-type. Specifically, the lateral Schottky structure of FIG. 25B includes a substrate, the layer of aluminum-alloyed gallium oxide ($Al_xGa_{2-x}O_3$) doped n-type, an ohmic contact formed on the implanted region 1800. and a Schottky contact formed on the aluminum-alloyed gallium oxide layer. The ohmic contact and the Schottky contact of FIG. 25B are formed along opposing ends of one side of the n-type, aluminum-alloyed gallium oxide layer.

In the example structures of FIGS. 24-25, the implanted regions 1600, 1700, 1800 may be n++ (e.g., degenerately doped) regions, and the Group IV ion implant may include any suitable Group IV element such as Si, Sn, Ge, etc. as explained above. Additionally, the n-type, aluminum-alloyed gallium oxide layers of FIGS. 24B and 25B may be doped with a Group IV (e.g., Si, etc.) by ion implant, diffusion, in situ doping during epitaxy, etc. Further, the substrates of FIGS. 24-25 may include, for example, a gallium oxide ($Ga_2O_3$) material, an aluminum-alloyed gallium oxide ($Al_xGa_{2-x}O_3$) material, a gallium nitride (GaN), a silicon carbide (SiC), a diamond (C) material, or another suitable material. Preferably, an upper layer of the substrate is not highly electrically conductive.

The vertical Schottky structure of FIG. 26 includes a layer of unintentionally doped (UID), aluminum-alloyed gallium oxide ($Al_xGa_{2-x}O_3$) material, an optically semi-transparent Schottky electrode formed on the UID layer, a region 1900 (shown with diagonal hatching) of a Group IV ion implant, two Schottky contacts formed on the semi-transparent Schottky electrode, and an ohmic contact formed on the implanted region 1900. In the example of FIG. 26, the implanted region 1900 and the semi-transparent Schottky electrode are positioned on opposing sides of the UID layer. Additionally, the implanted region 1900 may be an n++ (e.g., degenerately doped) region, and the Group IV ion implant may include any suitable Group IV element such as Si, Sn, Ge, etc., as explained above. As should be apparent to those skilled in art, the UID layer of FIG. 26 could be replaced by a layer with intentionally low-doped layer or a multi-layer structure including a low-doped layer. Additionally, it should be apparent that the semi-transparent Schottky electrode of FIG. 26 is not required for the device to function. In such examples, the two Schottky contacts may be formed on the UID layer (or alternatively the intentionally low-doped layer or the multi-layer structure including the low-doped layer).

The ohmic and/or Schottky contacts of FIGS. 24-26 may be formed in any suitable manner. For example, any one of the ohmic and/or Schottky contacts of FIGS. 24-26 may be formed by etching (e.g., reactive-ion etching, wet chemical etching, ion milling, etc.) at least a portion of the implanted $Al_xGa_{2-x}O_3$ material to form an etched region, depositing one or more electrically conductive materials on at least a portion of the etched region to form the ohmic contact, and (optionally) annealing the electrically conductive material(s) at a suitable temperature for a suitable period of time in a suitable environment, as explained herein In some embodiments, the substrates disclosed herein may be used for many purposes, including purposes other than as supporting structures. For example, in some examples, multiple layers (e.g., films) are positioned on top of a substrate, in a specific order or with specific properties, which are required to realize some or all of the benefits disclosed herein. For instance, the embodiment of FIG. 1 includes a substrate and multiple layers positioned on top of the substrate, each embodiment of FIGS. 13-16 includes a substrate and an Al—Ga—O/Ga—O/Al—Ga—O stack positioned on top of the substrate, and each embodiment of FIGS. 19A-C includes multiple Al—Ga—O layers with different properties.

Additionally, some of the substrates may allow current flow between their opposing sides. In such example substrates, sufficient electrical properties of the substrates may be necessary. For instance, the substrates (e.g., the UID layers, the aluminum-alloyed gallium oxide layers, etc.) of FIGS. 19, 22, 23, and 26 include sufficient electrical properties to allow current to flow between their opposing sides (e.g., in the vertical direction through the substrates).

As should be apparent to those skilled in art, the terms "alloy," "alloyed," and "alloying" and the terms "dope," "doped," and "doping" have different meanings. For example, and as used herein, the terms "alloy," "alloyed," and "alloying" refer to mixing an additional element in concentrations ~1% or more. As such, the aluminum component in aluminum-alloyed gallium oxide ($Al_xGa_{2-x}O_3$) is added in concentrations ~1% or more. In contrast, the terms "dope," "doped," and "doping" refer to mixing of an element in concentrations much less then (e.g., <<) 1 atomic %.

Additionally, X-ray powder diffraction (XRD) may be used on the samples disclosed herein. Using XRD may be used for the characterization of crystalline materials (e.g., phase identification), provide information on unit cell dimensions, etc. Further, S/TEM imaging on the samples show atomic-resolution implant-damage on a wide bandgap semiconductor.

As explained herein, employing ion implantation to dope aluminum-alloyed gallium oxide ($Al_xGa_{2-x}O_3$), followed by ohmic contact formation allows for precise control of electrical properties (e.g., a dopant density, a sheet resistance, a contact resistance, etc.). This precise control over the electrical properties may be achieved by tuning annealing temperatures, the atmosphere, the implant energies, implant dosages, and the number of implants performed. For example, contact resistivity and sheet resistance may be reduced when the annealing temperatures are between about 875° C. and about 1025° C. In some examples, low contact resistivity (e.g., 2.2E-03 Ohm-cm$^2$) may be realized when an activation anneal is performed at about 925° C. Additionally, a sheet resistance may reduce upon ion implantation (e.g., the ion implantation makes the aluminum-alloyed gallium oxide ($Al_xGa_{2-x}O_3$) material more conductive).

The examples and techniques disclosed herein may be a platform technology that opens the door to optimizing electrical and optoelectrical properties for power electronics (e.g., next-generation power electronics, etc.) based on the wide-bandgap, aluminum-alloyed gallium oxide ($Al_xGa_{2-x}O_3$) material. For example, the examples and techniques disclosed herein may be applicable to a wide variety of device structures such as HEMTs, MODFETs, MOSFETs, FinFETs etc.

The examples and techniques disclosed herein may be applicable to various power electronics applications such as, for example, solid-state RF power applications, electric vehicles, DC/DC power converters (e.g., power converters used in consumer electronics, power optimizers for PV systems, etc.), AC/DC power converters (e.g., wall chargers, power adapters, etc.). For example, the examples and techniques disclosed herein may be used to create devices that could replace GaN based devices in USB wall chargers. Additionally, the examples and techniques disclosed herein may be applicable to high-voltage applications such as, for example, transistors for kHz switches in high-voltage electronics (e.g., multi-kV substations, power inverters for industrial motor drives etc.).

Additionally, the use of ion implantation of group IV species (Si, etc.) into aluminum-alloyed gallium oxide ($Al_xGa_{2-x}O_3$) material may form one or more heavily doped layers for ohmic contacts. For example, a single doped layer of aluminum-alloyed gallium oxide ($Al_xGa_{2-x}O_3$) may be formed, multiple doped layers of aluminum-alloyed gallium oxide ($Al_xGa_{2-x}O_3$) having different conditions may be formed (e.g., each having the different x values), three-dimensional doped structures of aluminum-alloyed gallium oxide ($Al_xGa_{2-x}O_3$) may be formed, etc.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

In addition, disclosure of ranges includes disclosure of all values and further divided ranges within the entire range, including endpoints and sub-ranges given for the ranges. As referred to herein, ranges are, unless specified otherwise, inclusive of endpoints and include disclosure of all distinct values and further divided ranges within the entire range. Thus, for example, a range of "from A to B" or "from A to about B" is inclusive of A and B.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A semiconductor device comprising:
   a layer of an aluminum-alloyed gallium oxide ($Al_xGa_{2-x}O_3$) crystal structure, wherein $0<x<2$;
   at least one region including the $Al_xGa_{2-x}O_3$ crystal structure implanted with a Group IV element as a donor impurity with an ion implantation process to a concentration ranging from 1E18 $cm^{-3}$ to 1.5E20 $cm^{-3}$, and annealed, at a temperature ranging from 800° C. to 1100° C. for a period of time ranging from ten seconds to one hour, to activate the Group IV element; and
   an ohmic contact including one or more electrically conductive materials deposited on the at least one region.

2. The semiconductor device of claim 1, wherein the layer of the $Al_xGa_{2-x}O_3$ crystal structure is a first layer, the semiconductor device further comprising a second layer of the $Al_xGa_{2-x}O_3$ crystal structure and a third layer of a gallium oxide ($Ga_2O_3$) crystal structure positioned between the first and the second layers of the $Al_xGa_{2-x}O_3$ crystal structure.

3. The semiconductor device of claim 2, wherein the at least one region extends into the third layer of the $Ga_2O_3$ crystal structure.

4. The semiconductor device of claim 2, wherein the at least one region extends into the second layer of the $Al_xGa_{2-x}O_3$ crystal structure.

5. The semiconductor device of claim 2, further comprising a substrate, the second layer of the $Al_xGa_{2-x}O_3$ crystal structure positioned between the third layer of the $Ga_2O_3$ crystal structure and the substrate, wherein the at least one region extends to or into the substrate.

6. The semiconductor device of claim 1, wherein the one or more electrically conductive materials are annealed at a temperature ranging from 375° C. to 550° C. for a period of time ranging from ten seconds to ten minutes.

7. A method for forming an ohmic contact, the method comprising:
   implanting a Group IV element as a donor impurity into an aluminum-alloyed gallium oxide ($Al_xGa_{2-x}O_3$) crystal structure with an ion implantation process to a concentration ranging from 1E18 $cm^{-3}$ to 1.5E20 $cm^{-3}$, wherein $0<x<2$;
   annealing the implanted $Al_xGa_{2-x}O_3$ crystal structure, at a temperature ranging from 800° C. to 1100° C. for a period of time ranging from ten seconds to one hour, to activate the Group IV element to form an electrically conductive region; and
   depositing one or more electrically conductive materials on at least a portion of the implanted $Al_xGa_{2-x}O_3$ crystal structure to form the ohmic contact.

8. The method of claim 7, further comprising annealing the one or more electrically conductive materials at a temperature ranging from 375° C. to 550° C. for a period of time ranging from ten seconds to ten minutes.

9. The method of claim 8, wherein the temperature is about 470° C. and wherein the period of time is about one minute.

10. The method of claim 7, wherein the concentration is about 6E19 $cm^{-3}$, the temperature is about 925° C., and the period of time is about thirty minutes.

11. The method of claim 7, further comprising reactive-ion etching at least a portion of the implanted $Al_xGa_{2-x}O_3$ crystal structure to form an etched region, and wherein depositing the one or more electrically conductive materials includes depositing the one or more electrically conductive materials on at least a portion of the etched region to form the ohmic contact.

12. The method of claim 7, wherein annealing includes annealing in an oxygen-deficient environment.

13. A method for controlling a concentration of donors in an aluminum-alloyed gallium oxide ($Al_xGa_{2-x}O_3$) crystal structure, the method comprising:
   implanting a Group IV element as a donor impurity into the $Al_xGa_{2-x}O_3$ crystal structure with an ion implantation process to a concentration ranging from 1E18 $cm^{-3}$ to 1.5E20 $cm^{-3}$, wherein $0<x<2$; and
   annealing the implanted $Al_xGa_{2-x}O_3$ crystal structure, at a temperature ranging from 800° C. to 1100° C. for a period of time ranging from ten seconds to one hour, to activate the Group IV element to form an electrically conductive region.

14. The method of claim 13, wherein the concentration is about 6E19 $cm^{-3}$, the temperature is about 925° C., and the period of time is about thirty minutes.

15. The method of claim 13, wherein annealing includes annealing in an oxygen-deficient environment.

* * * * *